US008416610B2

(12) United States Patent
Juengling

(10) Patent No.: US 8,416,610 B2
(45) Date of Patent: Apr. 9, 2013

(54) SYSTEMS AND DEVICES INCLUDING LOCAL DATA LINES AND METHODS OF USING, MAKING, AND OPERATING THE SAME

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 57 days.

(21) Appl. No.: 12/792,557

(22) Filed: Jun. 2, 2010

(65) Prior Publication Data

US 2010/0238697 A1 Sep. 23, 2010

Related U.S. Application Data

(62) Division of application No. 12/033,768, filed on Feb. 19, 2008, now Pat. No. 7,742,324.

(51) Int. Cl.
*G11C 11/24* (2006.01)

(52) U.S. Cl.
USPC ...................... 365/149; 365/230.03

(58) Field of Classification Search .................. 365/149, 365/230.03, 148
See application file for complete search history.

(56) References Cited

U.S. PATENT DOCUMENTS

| | | | |
|---|---|---|---|
| 5,160,987 A | 11/1992 | Pricer et al. | |
| 5,815,428 A | 9/1998 | Tsuruda et al. | |
| 5,858,829 A | 1/1999 | Chen | |
| 5,969,990 A * | 10/1999 | Arase ...................... 365/185.25 | |
| 6,008,513 A | 12/1999 | Chen | |
| 6,081,008 A | 6/2000 | Rostoker | |
| 6,100,129 A | 8/2000 | Tu et al. | |
| 6,750,496 B2 | 6/2004 | Hayano et al. | |
| 6,936,510 B2 | 8/2005 | Itabashi et al. | |
| 7,132,333 B2 | 11/2006 | Schloesser et al. | |
| 7,235,456 B2 | 6/2007 | Sato et al. | |
| 7,291,533 B2 | 11/2007 | von Schwerin | |
| 7,301,192 B2 | 11/2007 | Harter et al. | |
| 7,312,492 B2 | 12/2007 | Gruning-Von Schwerin | |
| 7,402,856 B2 | 7/2008 | Brask et al. | |
| 7,442,976 B2 | 10/2008 | Juengling | |
| 7,445,985 B2 | 11/2008 | Schwerin | |

(Continued)

FOREIGN PATENT DOCUMENTS

| CN | 101044615 | 9/2007 |
|---|---|---|
| JP | 08236714 | 9/1996 |

(Continued)

OTHER PUBLICATIONS

Enrico Gilt; "Fabrication of Vertical MOSFETs With Reduced Parasitics and Suppression of Short Channel Effects"; Department of Electronics and Compter Science, Microelectronics Group; University of Southampton, Jun. 2004 http://66.102.1.104/scholar?hl=en&lr=&q=cache:BErKI49qg2MJ:www.ecs.soton.ac.uk/~eg02r/Publications/MinithesisEGili.pdf+dram+fins+%22process+flow%22+%22vertical+access%22.

(Continued)

*Primary Examiner* — Hoai V Ho
(74) *Attorney, Agent, or Firm* — Fletcher Yoder

(57) ABSTRACT

Disclosed are methods, systems and devices including local data lines. In some embodiments, the device includes a local data line connected to a plurality of access devices, at least a portion of a capacitor plate connected to the plurality of access devices, and a global data line connected to the local data line by the capacitor plate.

20 Claims, 22 Drawing Sheets

U.S. PATENT DOCUMENTS

| | | |
|---|---|---|
| 7,655,988 B2 | 2/2010 | Jang et al. |
| 2004/0188714 A1 * | 9/2004 | Scheuerlein et al. ......... 257/200 |
| 2006/0046407 A1 | 3/2006 | Juengling |
| 2007/0023805 A1 | 2/2007 | Wells et al. |
| 2007/0047357 A1 * | 3/2007 | Choi et al. .................... 365/207 |
| 2007/0278554 A1 * | 12/2007 | Song et al. .................... 257/314 |
| 2008/0303096 A1 * | 12/2008 | Schulz .......................... 257/365 |
| 2009/0184306 A1 * | 7/2009 | Mathew et al. .................. 257/3 |

FOREIGN PATENT DOCUMENTS

| | | |
|---|---|---|
| KR | 930005234 | 6/1993 |
| TW | 380316 | 1/2000 |
| WO | WO 2004/038770 | 5/2004 |

OTHER PUBLICATIONS

R. Katsumata, et al.; "Fin-Array-FET on bulk silicon for sub-100 nm Trench Capacitor DRAM"; 2003 Symposium on VLSI Technology Digest of Technical Papers; Jun. 2003, pp. 61-62.

T. Park, et al.; "Fabrication of Body-Tied FinFETs (Oega MOSFETs) Using Bulk Si Wafers"; 2003 Symposium on VLSI Technology Digest of Technical Papers; Jun. 2003, 2 pages.

* cited by examiner

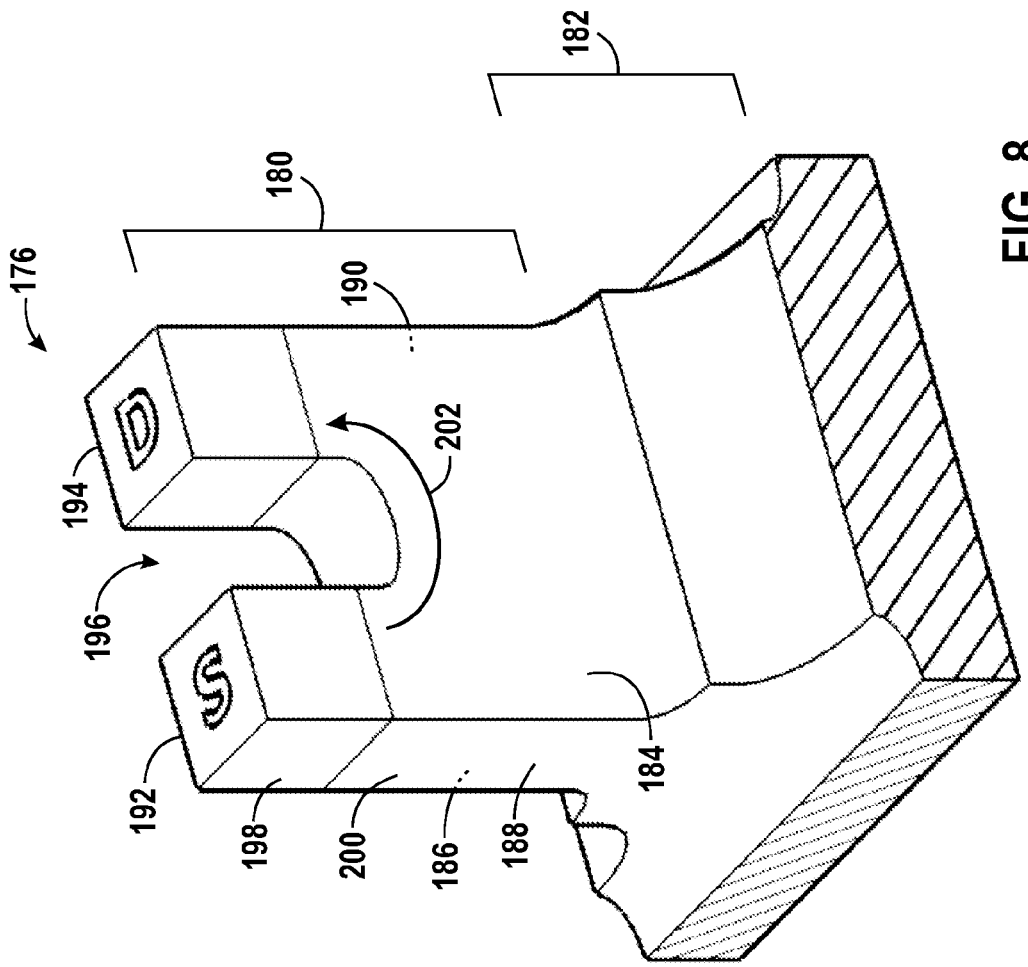
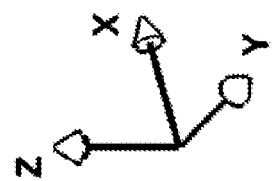
FIG. 8

SYSTEMS AND DEVICES INCLUDING LOCAL DATA LINES AND METHODS OF USING, MAKING, AND OPERATING THE SAME

CROSS-REFERENCE TO RELATED APPLICATION

This application is a divisional of U.S. patent application Ser. No. 12/033,768, filed on Feb. 19, 2008 which issued on Jun. 22, 2010 as U.S. Pat. No. 7,742,324.

BACKGROUND

1. Field of Invention

Embodiments of the invention relate generally to electronic devices and, more specifically, in certain embodiments, to electronic devices having local data lines.

2. Description of Related Art

In some memory devices, a storage device, such as a capacitor, communicates with a sense amplifier through a data line, e.g., a digit line. Typically, the capacitor stores data with its charge state, e.g., a charged capacitor may represent a logic value of "1," and an uncharged capacitor may represent a logic value of "0." To read data from the capacitor, a switch between the capacitor and the data line is closed, and electrons flow between the capacitor and the data line, thereby changing the voltage of the data line. This change in the voltage is typically registered by the sense amplifier, which may categorize the change in voltage as indicating either that the capacitor is storing a 0 or that the capacitor is storing a 1.

Often, the data lines have a relatively large capacitance compared to the capacitor storing data. In some designs, a single-data line may service a plurality of capacitors. These data lines may be relatively long, extending in some designs across an entire block of memory. Along their length, the data lines may capacitively couple to other conductors that are at different voltages, conductors such as other data lines. This capacitive coupling is referred to as "parasitic capacitance," and it can slow the operation of the memory device. Parasitic capacitance is known to slow the rate at which the capacitor storing data changes the data line voltage, thereby increasing the amount of time it takes to read data from the capacitor.

BRIEF DESCRIPTION OF DRAWINGS

FIGS. 8-19 illustrates steps in another process for forming local and global data lines in accordance with an embodiment of the present technique;

DETAILED DESCRIPTION

Figure 1:
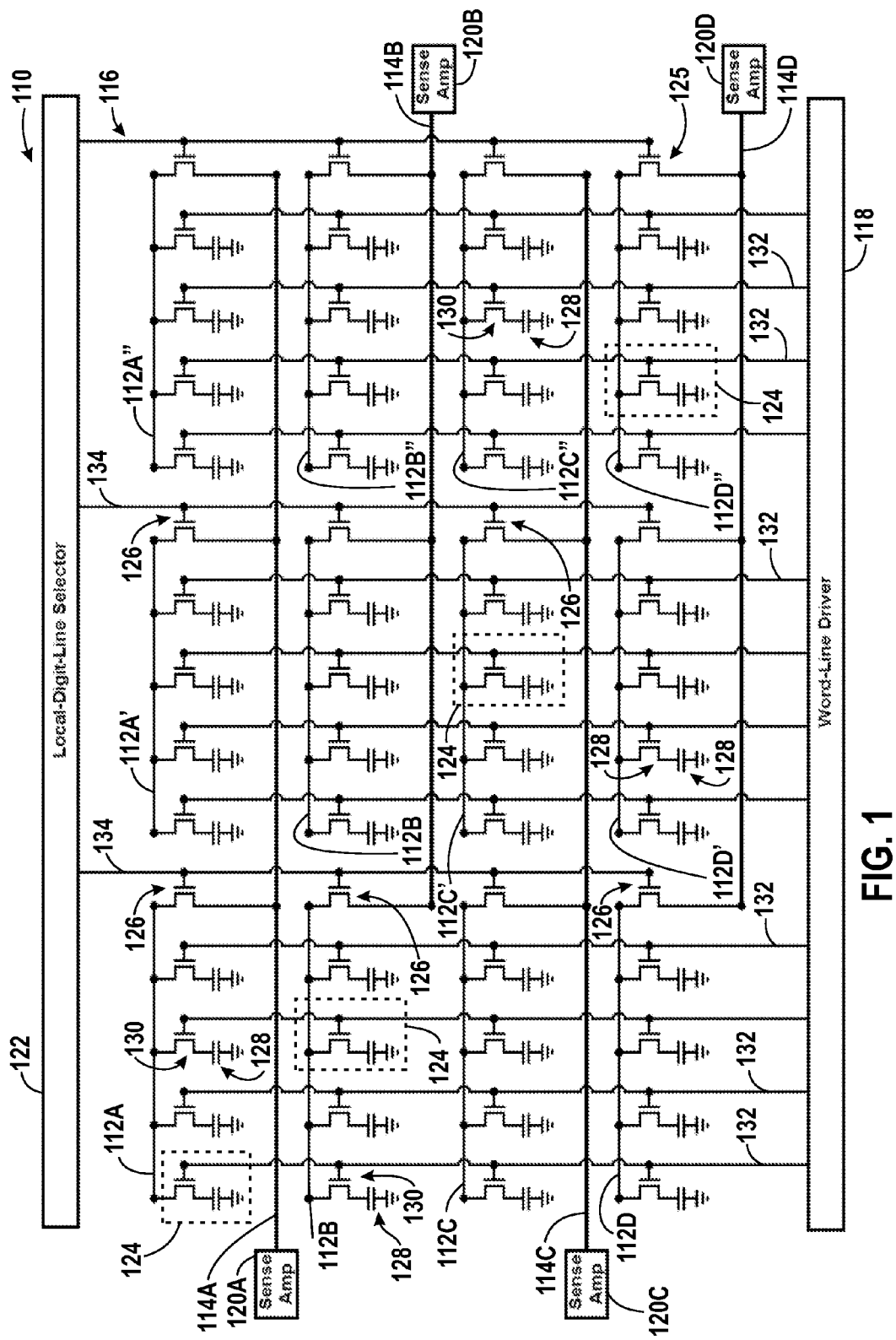
FIG. 1 illustrates a memory array having local and global data lines in accordance with an embodiment of the present technique.

Various embodiments of the present invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

As mentioned above, parasitic capacitance slows certain types of memory devices, but this problem is mitigated by some of the subsequently-described embodiments, among which is a memory device having local data lines that are shorter than the data lines of conventional devices. As explained below, in some embodiments, a data line for a plurality of memory cells may be divided into multiple, shorter segments referred to as "local data lines." Several local data lines may share a single global data line, and the global data line may connect the local data lines to a sense amplifier. In some embodiments, the local and global data lines may be linked to each other by switches that are configured to connect one local data line at a time to the global data line, thereby reducing the capacitance of the path between a memory cell and the sense amplifier.

In certain embodiments, the local data lines are coupled to the global data lines without interrupting the pattern of the memory array. Some of the following embodiments include a cross-point memory array, which as explained below, may be formed with a sequence of masks having repeating patterns of lines that are generally parallel to other lines in the same mask and generally perpendicular to the lines in other masks. The repetition of the pattern within the masks is believed to facilitate the formation of features that are smaller than the resolution limit of lithography equipment, and the orthogonal relationship between masks is believed to increase the alignment margins when aligning the masks to existing structures on a substrate. In certain embodiments described below, these relationships are not disturbed by the structures that connect the local data lines to the global data lines.

Several embodiments are described, including a circuit, two embodiments of a manufacturing process, and a system. The circuit is described with reference to FIG. 1, and the first embodiment of the manufacturing process is described with reference to FIGS. 2-7. The second manufacturing process is described with reference to FIGS. 8-19, and examples of systems embodying aspects of the invention are described with reference to FIGS. 20-23.

As mentioned, the circuit is illustrated by FIG. 1, which depicts an example of a memory device 110 having local data lines 112 and global data lines 114. The illustrated memory device 110 also includes a memory array 116, a control-line driver 118, sense amplifiers 120, and a local-digit-line selector 122. As illustrated, the local data lines 112 and the global data lines 114 are disposed in the memory array 116, and the sense amplifier 120 is coupled to the memory array 116.

The illustrated memory array 116 includes an array (e.g., a pattern of objects arranged in at least two-space dimensions) of memory cells 124 and local-digit-line-access devices 126 (LDL-access devices). In this embodiment, each memory cell 124 includes a storage device 128 and an access device 130. The illustrated access devices 130 are transistors that selectively connect the storage devices 128 to the local data lines 112. These access devices 130 each include a gate that is connected to the control-line driver 118 by a control line 132

(e.g., a word line). The illustrated storage devices 128 are capacitors with one plate connected to either ground or some other voltage source and another plate connected to a terminal, e.g., a source or a drain, of the access devices 130.

Another terminal of the access devices 130 may be connected to a terminal of the LDL-access device 126 by the local data lines 112. In the illustrated embodiment, the memory cells 124 are connected in parallel to the same terminal of the LDL-access device 126. Each of the illustrated local data lines 112 may be directly connected to four memory cells 124, but in other embodiments, the local data lines 112 may connect to fewer or more memory cells 124, e.g., 8, 16, 32, 64, 128, 256, 512, or more memory cells 124. The illustrated LDL-access devices 126 may include one or more transistors with gates connected to the local-digit-line selector 122 by subgroup-select lines 134.

Each of the illustrated local data lines 112 are connected to a sense amplifier 120 through a LDL-access device 126 and a global data line 114. Each global data line 114 may connect to a plurality of local data lines 112. In the illustrated embodiment, each global data line 114 connects to three local data lines, but in other embodiments, the global data lines 114 may connect to fewer or more local data lines 112, e.g., 4, 8, 16, 32, 64, or 128 local data lines 112. In some embodiments, the global data lines 114 may be manufactured to have lower resistance and lower capacitance per unit length than the local data lines 112. For example, the global data lines 114 may be larger, have a higher conductivity, and be spaced further away from one another than the local data lines 112. An example of a device having these features this described below with reference to FIGS. 8-19.

The illustrated local data lines 112 are connected to the global data lines 114 at the ends of the local data lines 112, but in other embodiments, the local data lines 112 may connect to the global data lines 114 at other locations. For instance, the local data lines 112 may connect to the global data lines 114 near the middle of the local data lines 112, or the local data lines 112 may connect to the global data lines 114 at multiple locations on the local data lines 112.

In operation, the storage devices 128 may store data that is transmitted via both the local data lines 112 and the global data lines 114. To address (e.g., read from, write to, or erase) a given memory cell 124, a stimulus (e.g., a voltage, current) may be asserted through a certain combination of local data lines 112 and control lines 132. To select the local data line 112 connected to the memory cell 124 being addressed, a stimulus may be asserted through the subgroup-select line 134 coupled to the gate of the LDL-access device 126 associated with the targeted local data line 112. To select a memory cell 124 among the memory cells 124 coupled to that local data line 112, another stimulus may be asserted through the control line 132 coupled to the gate of the access device 130 in the desired memory cell 124. In some embodiments, accessing a memory cell 124 may close a path through both the local data line 112 and the global data line 114 connected to that memory cell 124.

When reading from a selected memory cell 124, current may flow to or from the storage device 128, and this current may change the voltage of the global data line 114 coupled to the selected memory cell 124. The current may flow through the access device 130 in the selected memory cell 124, through the local data line 112 connected to the selected memory cell 124, and through the subgroup-access device 126 connected to the selected memory cell 124. As this current flows, it may elevate or lower the voltage of one of the global data lines 114. In some embodiments, the sense amplifier 120 may compare the changing voltage to one or more reference voltages and, based on this comparison, categorize the change in voltage as indicating that the selected memory cell 124 stores one of a discrete group of data values, e.g., one bit, two bits, three bits, four bits, five bits, or more.

In this embodiment, relative to conventional devices, the voltage of the global data lines 114 may quickly change to a voltage indicative of the stored data value. Because the global data lines 114 of this embodiment have relatively low resistance and relatively low capacitance, and because the illustrated global data lines 114 are connected to one local data line 112 at a time, the path between the sense amplifier and a selected memory cell 124 may have a lower impedance, and thus a lower time constant, than a path through all of the local data lines 112 together. This lower time constant may yield a quicker response by the sense amplifier 124 to a given voltage and a given current from a selected storage device 128. In some embodiments, this effect may be exploited by reducing the size of the storage devices 128, which may reduce the size of the memory array 116 and lower its cost. For example, in some embodiments, the storage devices 128 may have a capacitance less than 35 fF on a global data line with 256 bits (or more.

Other embodiments may include other types of memory cells 124 or devices other than memory cells. For example, the storage device 128 may be a floating gate of a floating-gate transistor or a charge repository of a silicon-oxide-nitride (SONOS) device, or it may include a phase-change memory material, e.g., an ovonic material. In some embodiments, the storage device 128 may be an SRAM memory element with a flip-flop, or it may include a programmable-metallization cell, a ferromagnetic-memory device, or a magnetoresistive-memory device. In other embodiments, the storage device 128 may include or be replaced with an imaging device, such as a charge-coupled device or a photo diode, or it may include or be replaced with some other type of sensor, such as a chemical sensor, a microphone, or an antenna. Because the present technique is applicable to a wide variety of devices, some of which store data and some of which sense data, the memory cell 124 may be referred to more generically as a "data cell," a term which encompasses both memory cells and various types of sensor cells.

Other embodiments may also have a different relationship between the memory cells 124 and the local data line 112. In the illustrated embodiment, the memory cells 124 are connected in parallel to the local data line 112, but in other embodiments, the memory cells 124 may be connected in series to the local data line 112. For example, in some types of flash-memory devices or SONOS devices, the floating-gate transistor or SONOS transistor may be connected in series along the local data line 112.

Local and global data lines may be formed by a process described below with reference to FIGS. 2-7. In some embodiments, this process may form local and global data lines without disrupting the pattern of transistors in the array. As explained below, maintaining this pattern is believed to increase the manufacturability of certain embodiments by, among other things, maintaining relatively large alignment margins in the array and facilitating the formation of sub-photolithographic-resolution-limit features.

Figure 2:
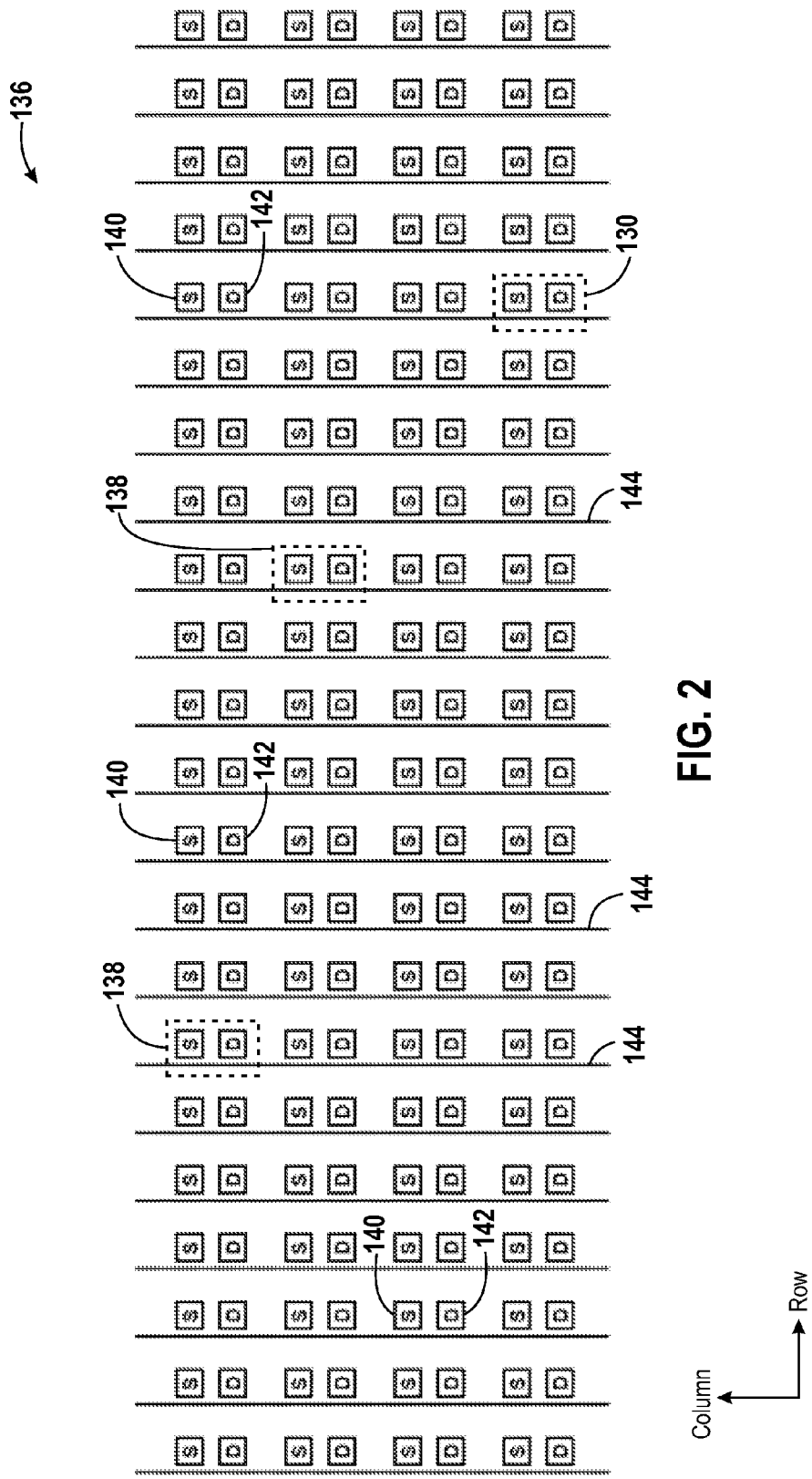
FIGS. 2-7 illustrates steps in a process for forming local and global data lines in accordance with an embodiment of the present technique.

In one embodiment, the process begins with providing an array 136 of transistors 138, as illustrated by FIG. 2. The transistors 138 may be arrayed in generally linear rows and columns, in a square lattice arrangement, as illustrated by FIG. 2, or they may be arranged in some other pattern, such as a hexagonal-lattice arrangement, with offset-adjacent rows of transistors 138. The illustrated array 136 may include patterns of transistors 138 that repeat in both the row and column direction within a relatively short period, e.g., every transistor, every two transistors, every three transistors, every four transistors, or every five transistors. Each of the illustrated transistors 138 includes a source 140 and a drain 142. Additionally, each illustrated transistor 138 is coupled to a gate line 144 via the transistor's gate. As explained below, some of these gate lines 144 may be used to form control lines, and others may be used to form subgroup-select lines. The transistors 138 may be a variety of different types of transistors, including single-gate transistors, dual-gate transistors, triple-gate transistors, generally two-dimensional transistors, and generally three-dimensional transistors. An example of a dual-gate, three-dimensional transistor is described below with reference to FIGS. 8-19.

Figure 3:
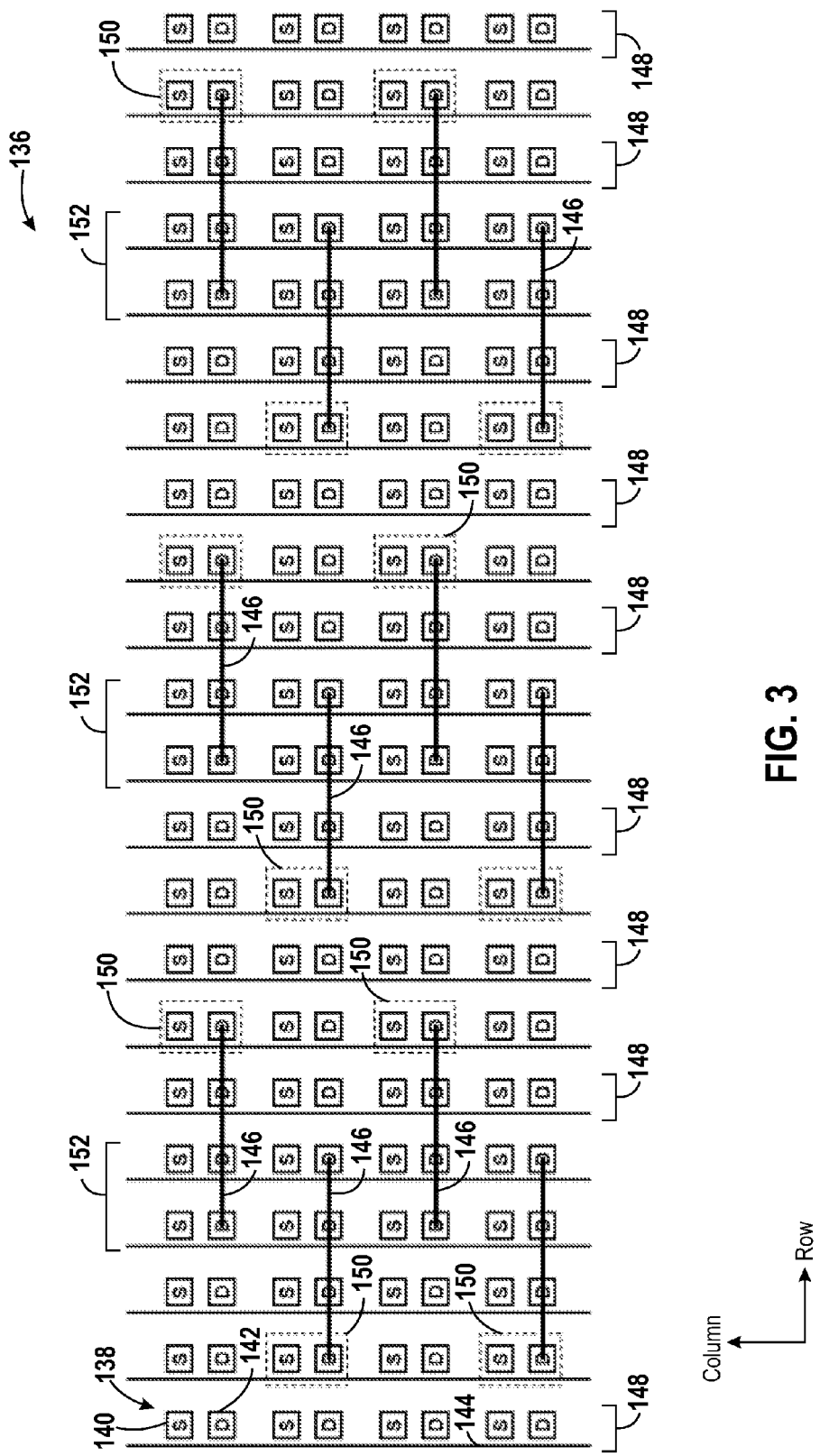

Next in the present embodiment, local data lines 146 may be formed, as illustrated by FIG. 3. The local data lines 146 may extend generally perpendicular to the gate lines 144, and they may connect to the sources 140 or the drains 142 of the transistors 138. Each of the illustrated gate lines 146 extends across generally the same number of transistors 138, e.g., four transistors in the illustrated embodiment, but may extend across a different number of transistors in other embodiments. The local data lines 146 may be staggered by two or more transistor 138 to form dummy columns 148. As explained below, the dummy columns 148 may provide a buffer space around the ends of the local data lines 146 to allow for misalignment of the contacts to the local data lines 146.

The illustrated embodiment includes LDL-access devices 150. The LDL-access devices 150 may be disposed at alternating ends of the local data lines 146 in the column direction, but in other embodiments, the local data lines 146 may extend beyond the LDL-access devices 150 or the LDL-access devices 150 may be disposed near the same end of the local data lines 146. In this embodiment, a dummy row 148 is disposed on either side of the column in which the LDL-access devices 150 are disposed. Additionally, the transistors 138 between LDL-access devices 150 in the same column may be dummy transistors, so in this embodiment, each LDL-access device 150 is surrounded by dummy transistors. In other embodiments, though, the array 136 may not include dummy transistors, and the data lines 146 may not be staggered.

In some embodiments, the local data lines 112 may be staggered such that their ends are disposed near the middle of adjacent local data lines 112. In some instances, the local data lines 112 may be staggered the access devices 150 may be disposed near their middle.

Some or a substantially all of the remaining transistors 138 that are not either dummy transistors or LDL-access devices 150 may become access devices 152 for subsequently-formed memory cells. In this embodiment, the access devices 152 are disposed in groups of columns that are two columns wide. In other embodiments, these groups of columns may be substantially wider, e.g., wider than or generally equal to 4, 8, 16, 32, 64, 128, or 256 transistors wide or wider.

Figure 4:
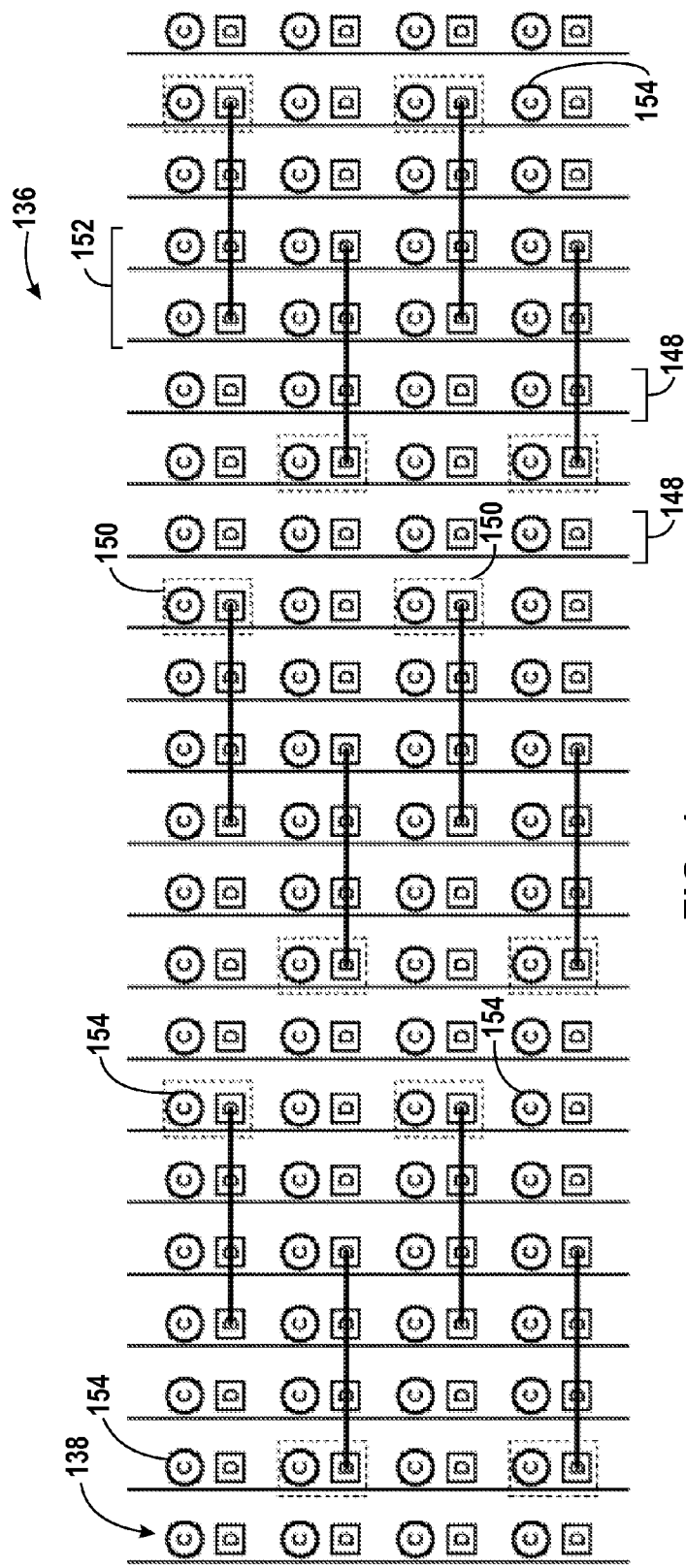

Next in this embodiment, storage devices 154 may be formed in the array 136, as illustrated by FIG. 4. The storage devices 154 may be any of the types of storage device as described above, and in the illustrated embodiment, they are capacitor plates. The illustrated storage devices 154 are disposed above and generally aligned with a terminal of the transistors 138, e.g., a source 140 or a drain 142, and the storage devices 154 may be coupled to this terminal. The storage devices 154 may be formed without disrupting the pattern of the array 136. In the illustrated embodiment, all or substantially all of the transistors 138 of the array 136 are coupled to a storage device 154, including, the access devices 152, the LDL-access devices 150, and the transistors 138 in the dummy rows 148. As explained below, in some embodiments, the storage devices 154 coupled to the LDL-access devices 150 may be used to form contacts to the LDL-access devices 150 from global data lines.

Figure 5:
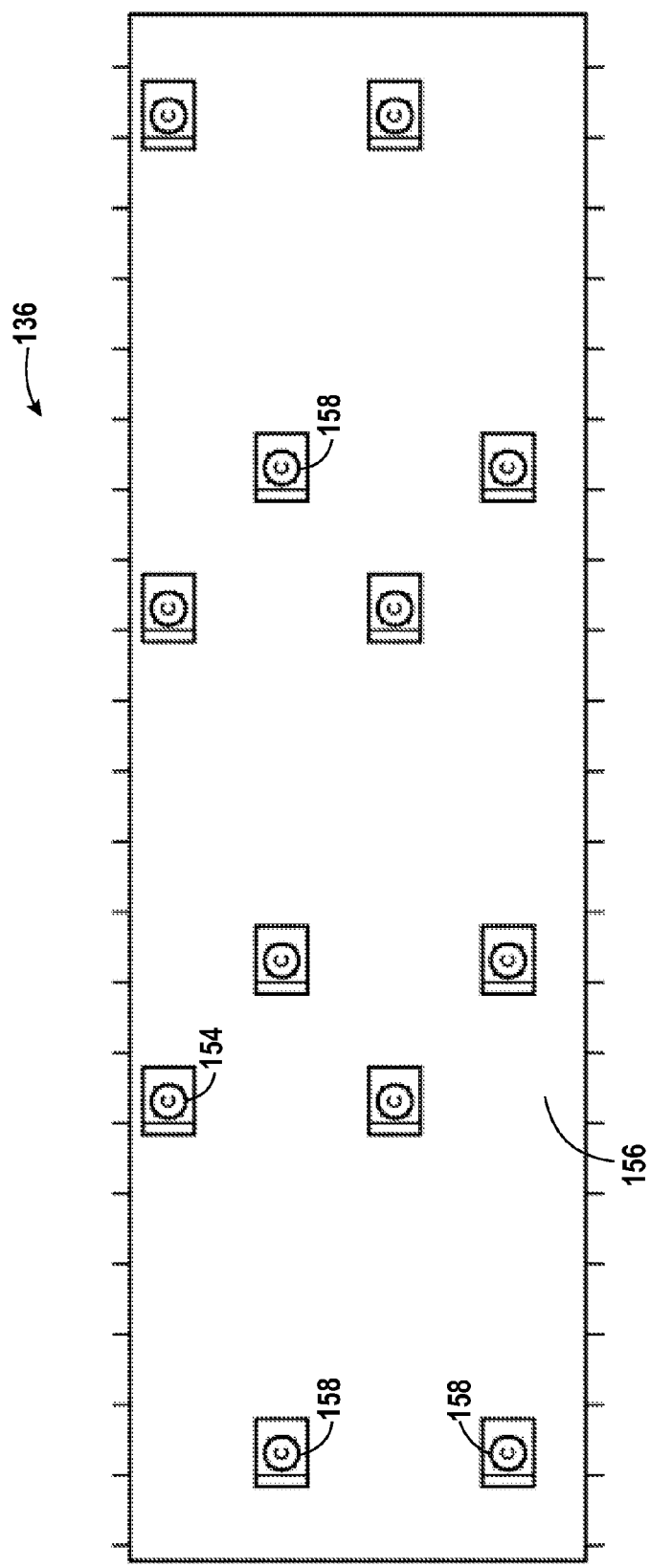

In certain embodiments, the storage devices 154 may include another capacitor plate 156, as illustrated by FIG. 5. The capacitor plate 156 may be common to all or substantially all of the storage devices 154 in the array 136, or the capacitor plate 156 may be common to transistors 138 in a row, column, or other subset of the array 136. In some embodiments, each storage device 154 includes its own capacitor plate 156 that is separate from the capacitor plates 156 of other storage devices 154. A dielectric material may be disposed under the capacitor plate 156, between it and the other capacitor plate of the storage devices 154, to form capacitors.

A plurality of apertures 158 may be opened in the capacitor plate 156 to expose a portion or substantially all of certain storage devices 154. The apertures 158 may be positioned and sized to expose the storage devices 154 coupled to the LDL-access devices 150. In some embodiments, the apertures 158 may be large enough to expose a portion of the storage devices 154 coupled to the dummy transistors 148 disposed around the LDL-access devices 150.

Figure 6:
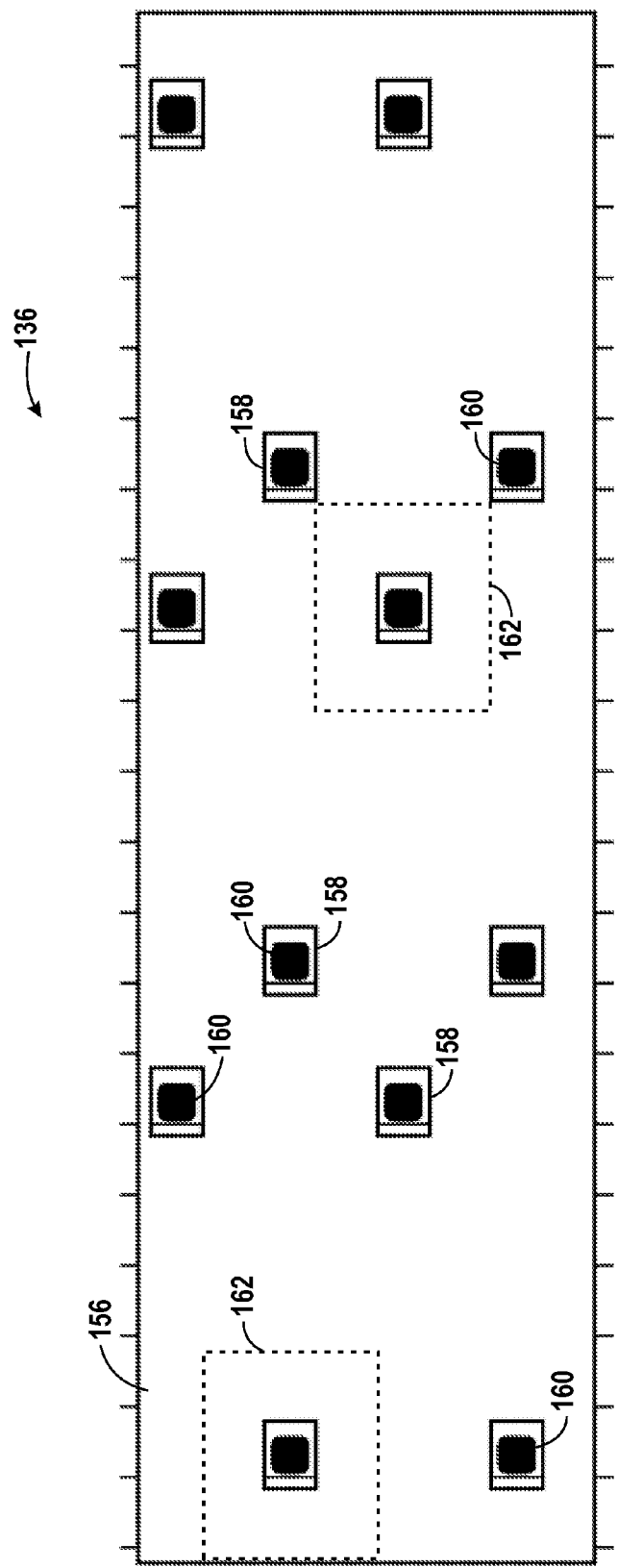

Next, contacts 160 to the storage devices 154 may be formed in the apertures 158, as illustrated by FIG. 6. In some embodiments, an insulating-liner layer may be formed between the contacts 160 and the capacitor plate 156 to prevent current from flowing between these structures 160 and 156. The contacts 160 may be generally vertical structures made of a conductive material, and a contact 160 may be formed over all or substantially all of the LDL-access devices 150 (FIG. 3).

The apertures 158 and the contacts 160 may have a relatively large alignment margin in some embodiments because of the dummy transistors 148 (FIG. 3). These dummy transistors 148 may form a spatial buffer 162 around each of the contacts 160 (FIG. 6). In at least some embodiments, misalignment of the contacts 160 does not necessarily damage memory cells that store data because of the special buffer 162. This relatively large alignment margin may facilitate the use of less expensive, lower resolution lithography equipment.

Figure 7:
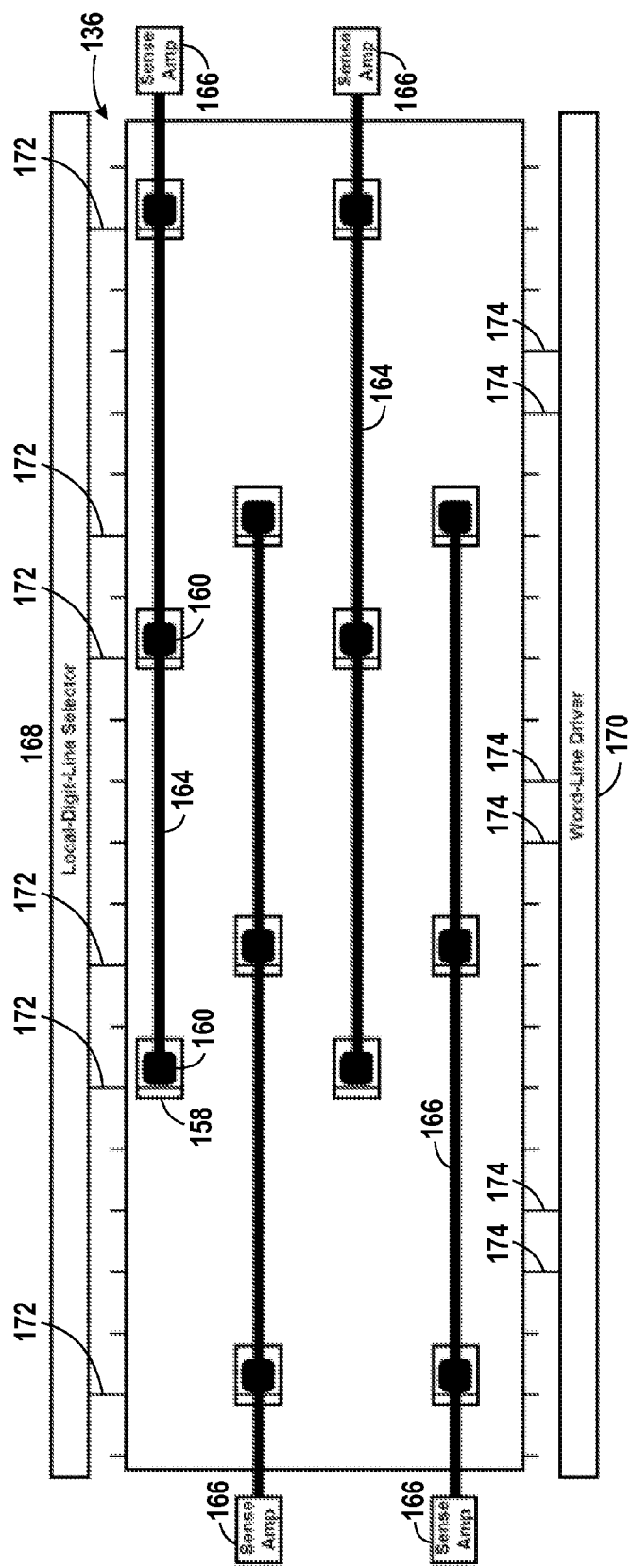

Next, global data lines 164 and 166 may be formed, as illustrated by FIG. 7. The global data lines 164 and 166 may connect the contacts 160 to the sense amplifiers 166. In some embodiments, the global data lines 164 may be formed before the global data lines 166, e.g., in a different metal layer. The global data lines 164 and 166 may be generally the same size as the local data lines 146, and the global data lines 164 and 166 may be spaced further away from one another than the local data lines 146, e.g., 1.5 times as far, 2 times as far, or further. This increased spacing may reduce capacitance between the global data lines 164 and 166.

The array 136 may also be connected to a local-digit-line selector 168 and a control-line driver 170. The local-digit-line selector 168 may connect to the gate lines 144 (FIG. 2) of the columns with the LDL-access devices 150 (FIG. 4) to form subgroup select lines 172 (FIG. 7). Certain other gate lines 144 may connect to the control-line driver 172 form control lines 174. The control lines 174 may control the access devices 152 (FIG. 3) of functioning memory cells. In this embodiment, each illustrated local data line couples to two memory cells via two control lines 174. In other embodiments, each local data line may connect to more than two memory cells.

In other embodiments, the global data lines 164 may connect to each of the local data lines 146 through more than one LDL-access device 150, e.g., 2, 3, 4, or more LDL-access devices 150. In these embodiments, each local data line 146 may connect to a global data line 164 through a plurality of LDL-access devices connected to the global data line 164 in parallel. To accommodate the larger number of connections, the contact 160 and the aperture 158 may be widened to span across multiple columns of storage devices 154. For example, a single contact 160 or two separate contacts 160 may connect to a local data line 146 via two different capacitor plates. Connecting the local data line 146 to the global data line 164 through parallel LDL-access devices 150 is believed to reduce the resistance between the global data lines 146 and the global data lines 164.

In some embodiments, the storage devices 154 may be selected based on an address received from other circuitry. For example, a memory controller may transmit an address, and based on this address a control line 174 corresponding with the desired memory cell may be energized, and a sense amplifier 165 corresponding memory cell may sense the voltage of the global data line 166 to which it is attached.

In some embodiments, a first, last, or other digit, or group of digits of the address may determine which subgroup-select line 172 is energized. For instance, if the last digit of the address is a zero, the local data line selector may energize a subgroup-select line 172 coupled to an odd-numbered local data line 146, or if the last digit of the address is a one, the local data line selector may energize a subgroup-select line 172 coupled to an even-numbered local data line 146.

In other embodiments, multiple digits of the address may affect which subgroup select line 172 is energized. For example, if the last three digits of the address are 000, a left-most subgroup-select line 172 coupled to an odd-numbered local data line 146 may be energized, or if the last three digits of the address are 010, then a second-from-left-most subgroup-select line 172 coupled to an odd-numbered local data line 146 may be energized. Similarly, if the last three digits of the address are 001, a left-most subgroup-select line 172 coupled to an even-numbered local data line 146 may be energized, and if the last three digits of the address are 011, then a second-from-left-most subgroup-select line 172 coupled to an even-numbered local data line 146 may be energized. Several permutations of this pattern and others are envisioned.

Figure 9:
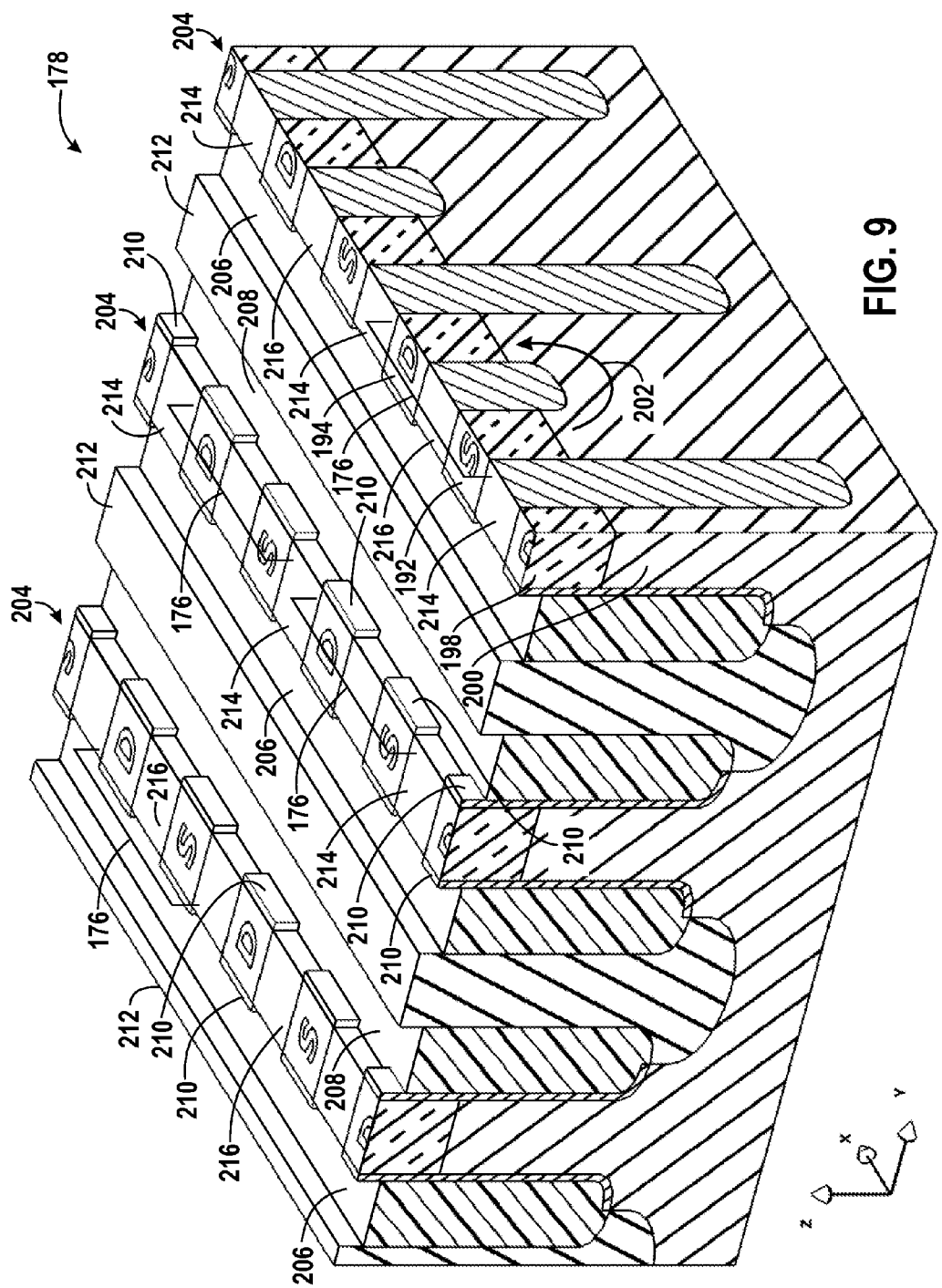

FIGS. 8-19 illustrate an example of a process for forming local data lines and global data lines that connect to fin transistors. To explain this embodiment, FIG. 8 illustrates a semiconductor portion of a fin transistor 176, and FIG. 9 illustrates an array 178 of fin transistors 176. The other figures depict steps that may connect the array 178 to local data lines and global data lines.

As illustrated by FIG. 8, the semiconductor portion of each illustrated fin transistor 176 may include a fin 180 extending from a base 182. The fin 180 and the base 182 may be made from a variety of semiconductor materials, such as single-crystal silicon. The illustrated fin 180 includes two sides 184 and 186 and two edges 188 and 190. The sides 186 and 184 and the edges 188 and 190 may, in some embodiments, define a generally cuboid volume, with the edges 188 and 190 generally being narrower than the sides 184 and 186. The illustrated fin 180 includes a distal portion with two legs 192 and 194 separated by a generally U-shaped void 196. As explained below, the legs 192 and 194 may provide the material from which a source and a drain are formed. The fin 180 may include differently-doped portions 198 and 200. In some embodiments, the upper-doped portion 198 may be doped with an n+ material, and the lower-doped portion 200 may be doped with a p− material. In the illustrated embodiment, the upper-doped portion 198 does not extend below the bottom of the generally U-shaped void 196. This is so that a channel may be formed through the lower-doped portion 200, between the two legs 192 and 194. As explained below with reference to FIG. 9, gates may be disposed against the sides 184 and 186 of the fin 180, and electromagnetic fields emanating from these gates may establish a channel through which current 202 flows from the source to the drain.

FIG. 9 illustrates an example of the array 178 of the transistors 176. The illustrated transistors 176 are generally arranged in columns 204, and each column 204 may include gates 206 and 208 disposed on either side of the column 204. Each of the illustrated gates 206 and 208 may be separated from the semiconductor portion of the transistors 176 by a gate dielectric 210. Each illustrated column of transistors 204 may be isolated from the adjacent column of transistors 204 by an inter-column dielectric 212, and each transistor 176 with in a column 204 may be isolated from adjacent transistors 176 in the same column 204 by an inter-row dielectric 214. In some embodiments, the generally U-shaped void 196 may be filled in inter-leg dielectric 216.

In some embodiments, the array 178 may be manufactured with a cross-point process. In one example of this type of process, the array 178 is patterned with a sequence of masks that form generally orthogonal lines. For example, initially, a blank substrate may be field implanted with dopants to form the upper-doped region 198 and the lower-doped region 200, and then, the inter-row dielectric 214 and the inter-leg dielectric 216 may be patterned with one or more masks having a pattern of lines generally extending in the Y direction. In some embodiments, these features 214 and 216 are patterned with sub-lithographic-resolution techniques, such as undercutting a hard mask, reflowing photoresist, or double pitching a mask with sidewall spacers.

Next, the other features of the array 178 may be patterned with one or more additional masks having lines generally extending in the X direction. (It is from the generally orthogonal relationship between the lines of the first and second set of masks that the cross-point array process takes its name.) In some embodiments, the fins 180 may be etched and, then, the gates 206 and 208 may be formed as sidewall spacers along the sides of the fins 180. The inter-column dielectric 212 may then be formed between the sidewall spacers to isolate the gates 206 and 208. In other embodiments, the inter-column dielectric 212 may be formed before the gates 206 and 208. For example, trenches extending in the X direction may be etched and filled with material for the inter-column dielectric 212 and, then, trenches for the gates 206 and 208 may be etched, thereby generally simultaneously defining both the fins 180 and the shape of the inter-column dielectric 212. In some embodiments, the fins 180, the gates 206 and 208, and the inter-column dielectric 212 may be patterned with sub-lithographic-resolution techniques as well, and one or more of them may have widths that are less than or generally equal to the lithographic-resolution limit, e.g., less than the photo-lithographic-resolution limit.

In operation, a current 202 between the source and the drain of the transistors 176 may be controlled by modulating the voltage of the gates 206 and 208. In some embodiments, the gates 206 and 208 may be connected to one another and may generally have the same voltage, or in other embodiments, the gates 206 and 208 may be controlled independent of one another and have different voltages. As explained below, some of the pairs of gates 206 and 208 may form control lines, and some of the other pairs of gates 206 and 208 may form subgroup-select lines.

Figure 10:
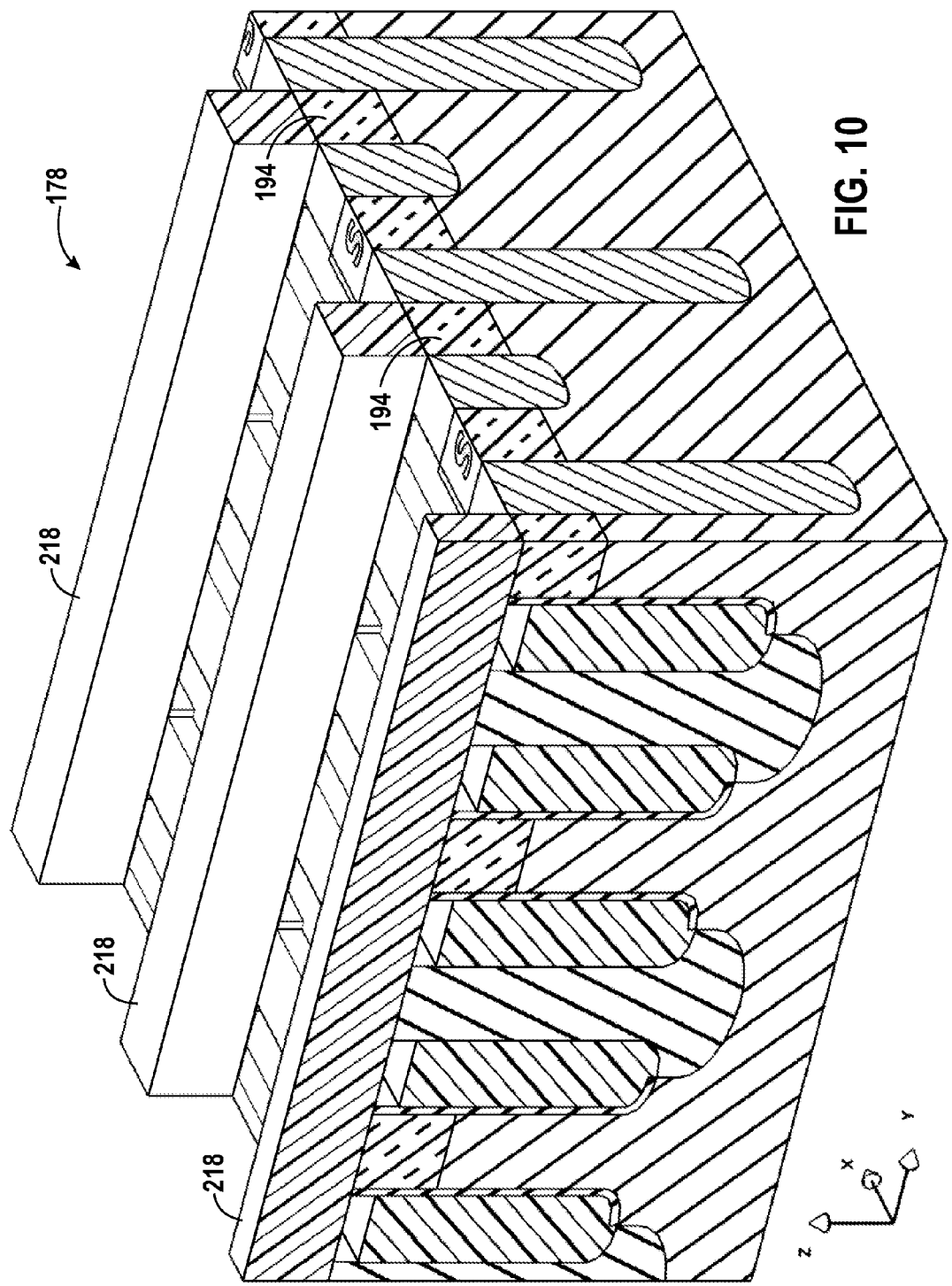

As illustrated by FIG. 10, data lines 218 may be formed on the array 178. In this embodiment, the data lines 218 are formed by depositing a generally conductive material and patterning the generally conductive material to form generally straight and generally parallel lines generally extending in the Y direction. The illustrated data lines 218 connect to the drains of the transistors 176, which in this embodiment corresponds with the legs 194. In other embodiments, the data lines 218 may connect to the sources, and the data lines 218 may not be straight, e.g., they may undulate to accommodate an array having a different pattern, such as a hexagonal lattice.

Figure 11:
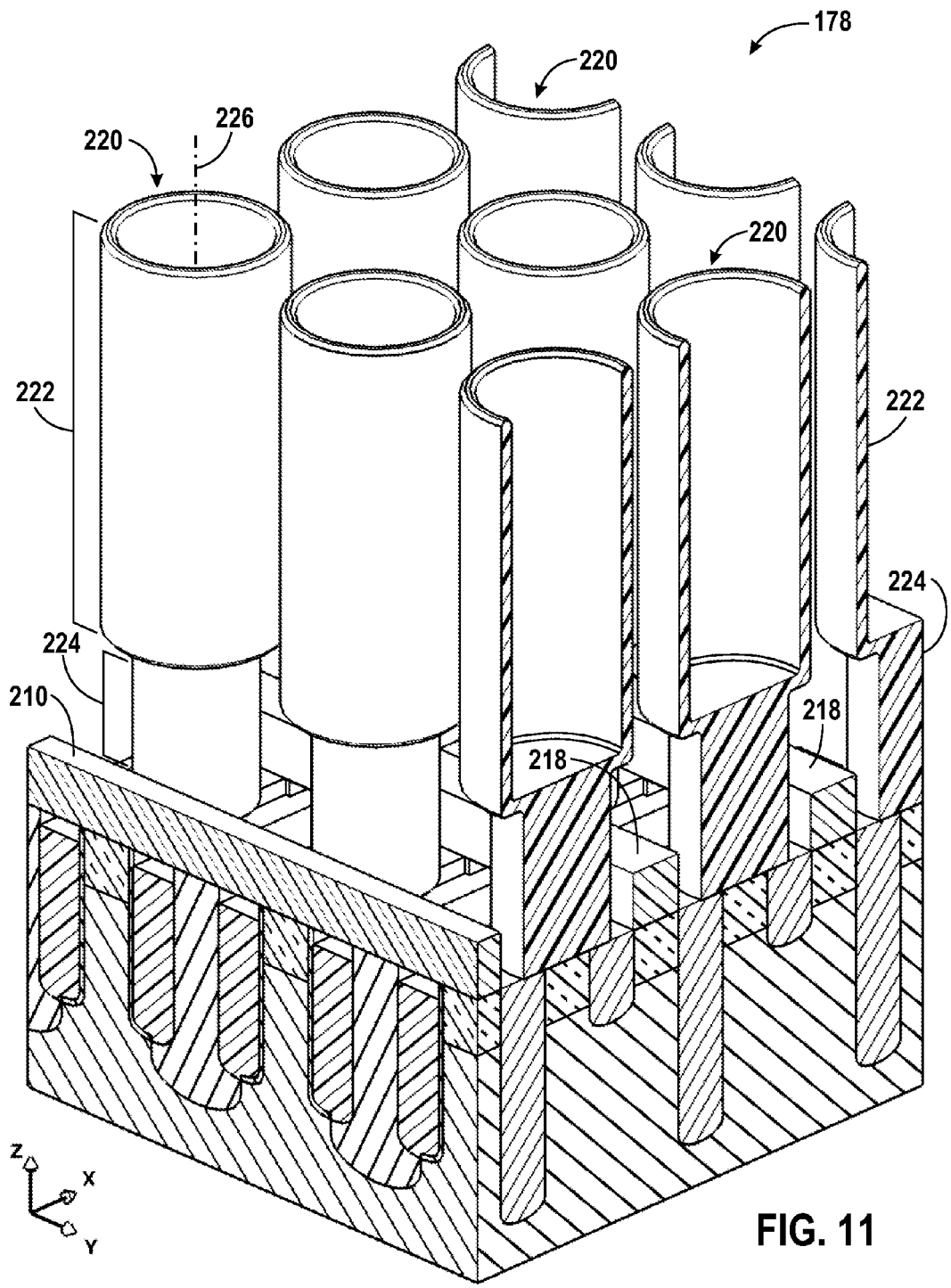

After forming the data lines 218, the data lines 218 may be covered with an insulator and capacitor plates 220 may be formed, as illustrated by FIG. 11. To show the capacitor plates 220 clearly, the insulator over the data lines 218 is not shown in FIG. 11, but subsequent figures depict this material. The illustrated capacitor plates 220 include a generally cup-shaped distal portion 222 and a generally cylindrical base 224. In this embodiment, the capacitor plates 220 include features that are generally concentric about a central axis 226, but in other embodiments, the capacitor plates 220 may have a different shape, e.g., an oval or elliptical shape. In certain embodiments, the capacitor plates 220 may be part of trench capacitors formed below the transistors 176. The capacitor plates 220 may be made from a generally conductive material, such as polysilicon, and they may be formed in generally circular holes in a sacrificial material. The base 224 of each of the illustrated capacitor plates 220 connects to the source of one of the transistors 176, which in this embodiment correlates with the leg 192 (FIG. 9).

Figure 12:
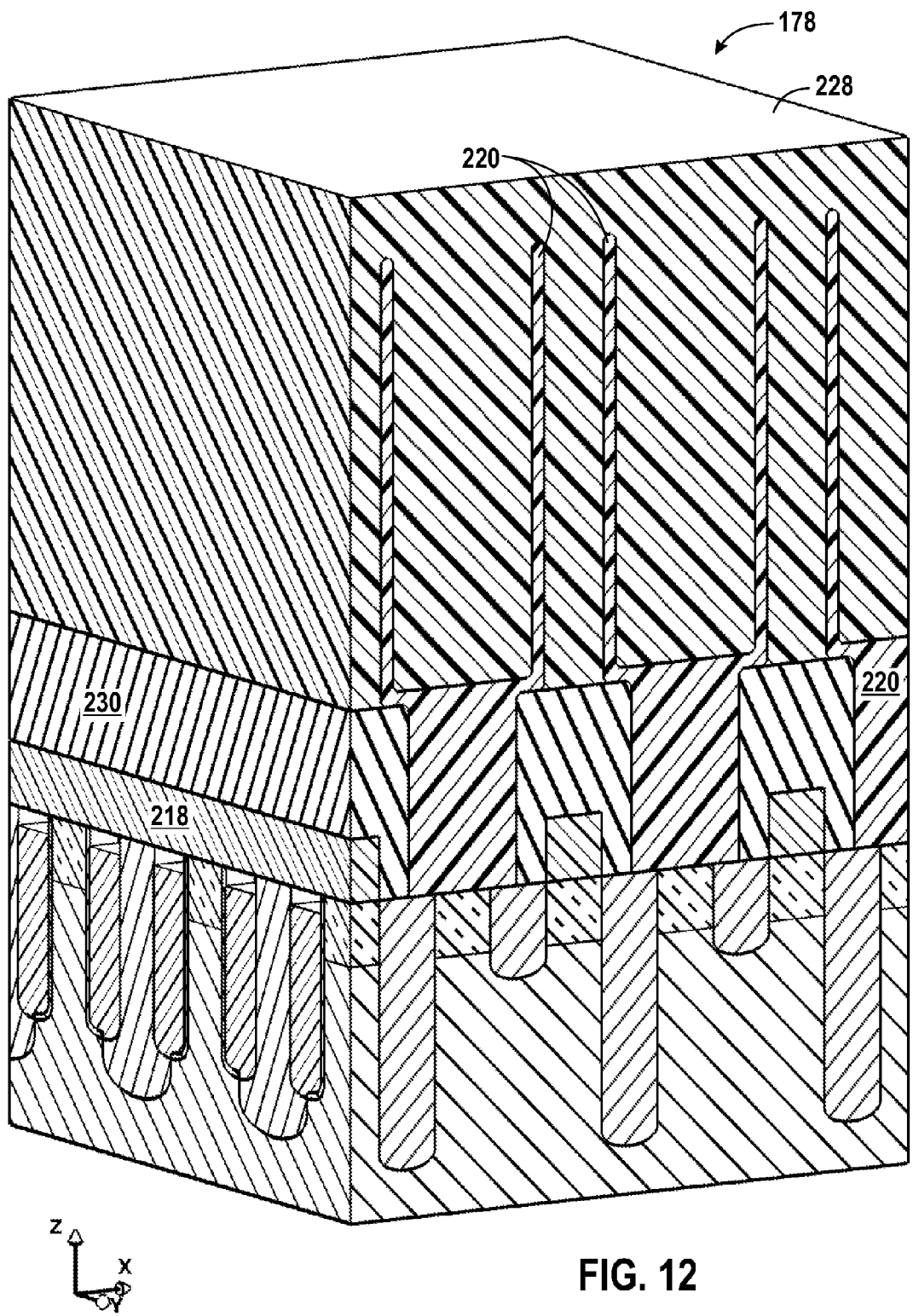

Next, the capacitor plates 220 may be coated with a capacitor dielectric and another capacitor plate 228 may be formed, as illustrated by FIG. 12. In some embodiments, the capacitor plate 228 may be common to a substantial number or substantially all of the capacitor plates 220. The capacitor plate 228 may be made of a conductive material, such as polysilicon. In some embodiments, the capacitor plates 220 and 228 may be made of the same material, or they may be made of different material to facilitate selective removal of portions of the capacitor plate 228 in subsequent steps. FIG. 12 also illustrates a dielectric 230 disposed between the data lines 218 and the capacitor plates 220 and 228.

Figure 13:
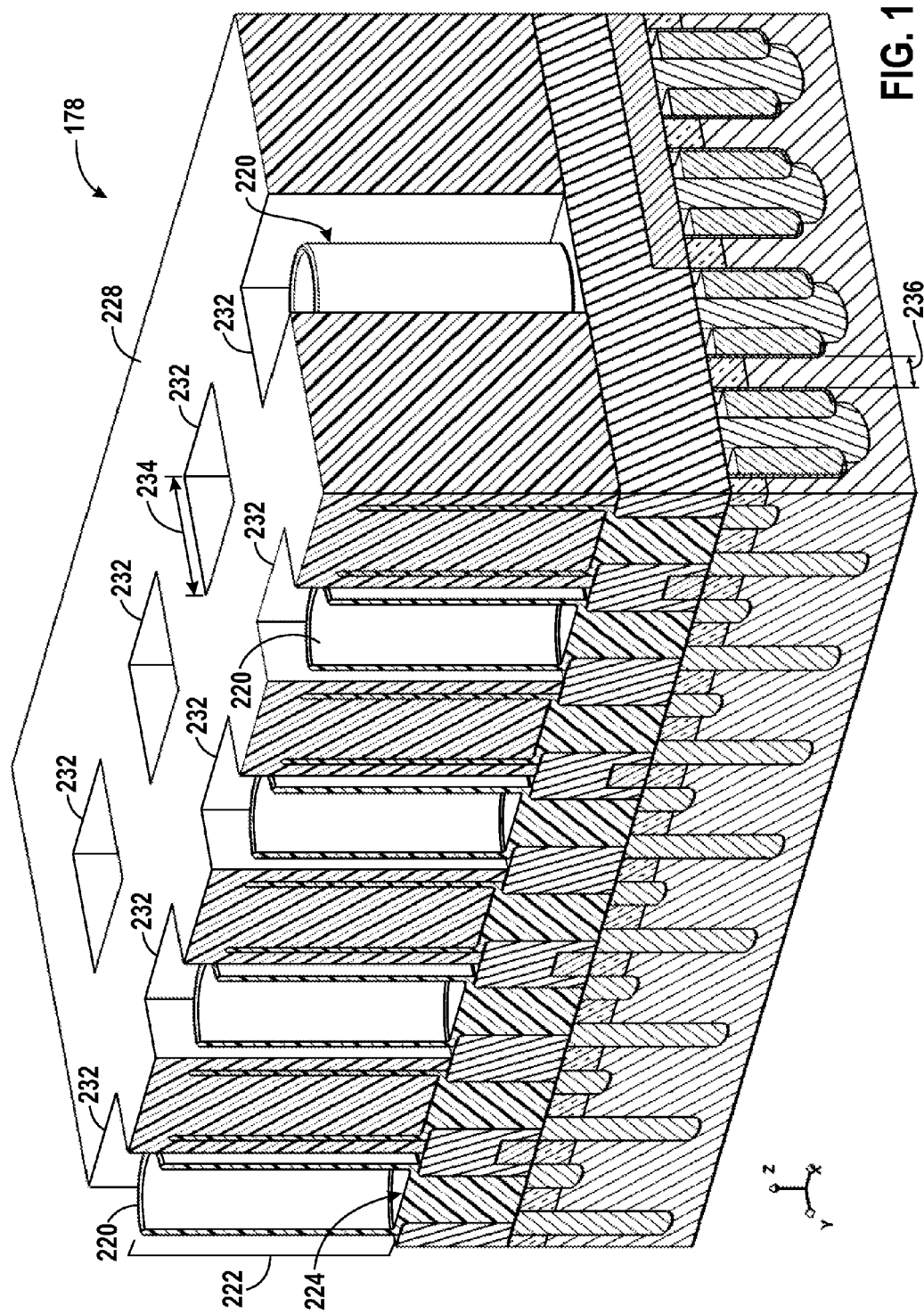

FIG. 13 illustrates apertures 232 that may be cut through or into the capacitor plate 228. The apertures 232 may have a width 234 that is substantially larger than a width 236 of the fins 180, e.g., the width 234 may be two or more times as large or larger than the width 236. In some embodiments, a dielectric material may be formed over the capacitor plate 228 before forming the apertures 232, and the apertures 232 may extend through both the dielectric material and the capacitor plate 228. It should also be noted that in some embodiments, the process of etching the apertures 232 may consume a substantial portion, or all, of the cup-shaped portion 222 of the capacitor plates 220 within the apertures 232. In some embodiments, the apertures 232 may be formed with an etch that stops on or in the dielectric 230, and the etch may consume the cup-shaped portion 222, thereby exposing the base 224 of the capacitor plate 220. In certain embodiments, not all of the illustrated apertures 232 may be etched at once. For example, the apertures 232 above even or odd numbered columns may be etched first, and after forming contacts in the existing apertures 232 and connecting to these contacts, the other illustrated apertures 232 may be formed. In some embodiments, the apertures 232 may be disposed near the middle of the length of the local data lines, and the local data lines may be staggered.

Figure 14:
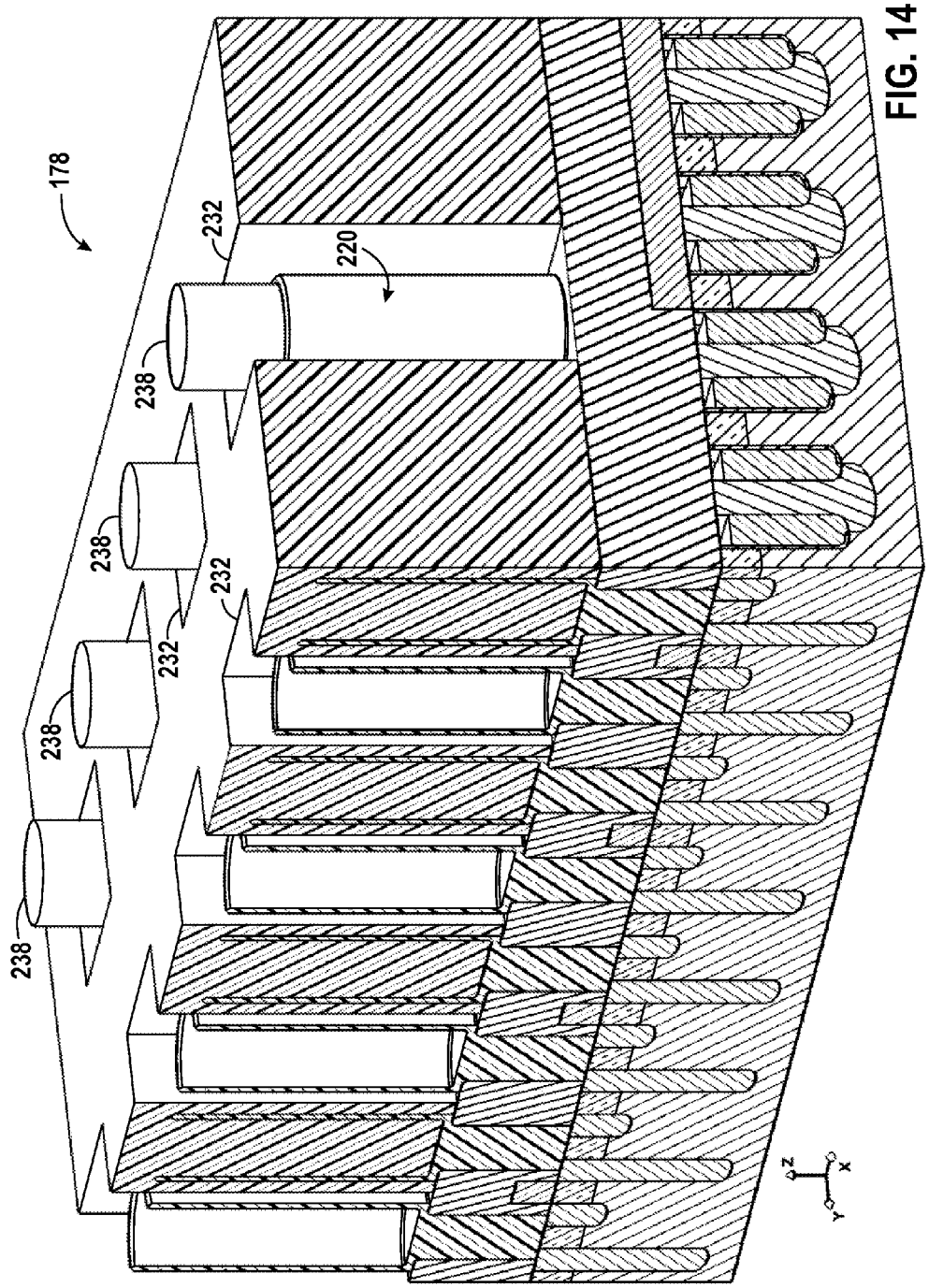

Next, as illustrated by FIG. 14, contacts 238 may be formed in some or all of the apertures 232. The contacts 238 may be made of a generally conductive material, and they may make contact with a portion of the capacitor plate 220 disposed within the apertures 232. In some embodiments, an insulating sidewall spacer may be formed within the aperture 232 before forming the contacts 238, and the contacts 238 may include various liner materials, such as titanium nitride or tungsten nitride. In some embodiments, the contacts 238 may establish electrical contacts with alternating rows of transistors 176, i.e., the contacts 238 may skip rows of transistors 276 and make contact with odd-numbered rows or even-numbered rows. The illustrated contacts 238 are generally aligned with, and generally disposed within, the capacitor plates 220, but in other embodiments, the contacts 238 may be larger than or misaligned with the capacitor plates 220 while still making electrical contact with the capacitor plates 220. In some embodiments, the contacts 238 may make electrical contact with two or more adjacent capacitor plates 220, e.g., two capacitor plates 220 coupled to transistors 176 on the same row and adjacent columns 204 (FIG. 9).

Figure 15:
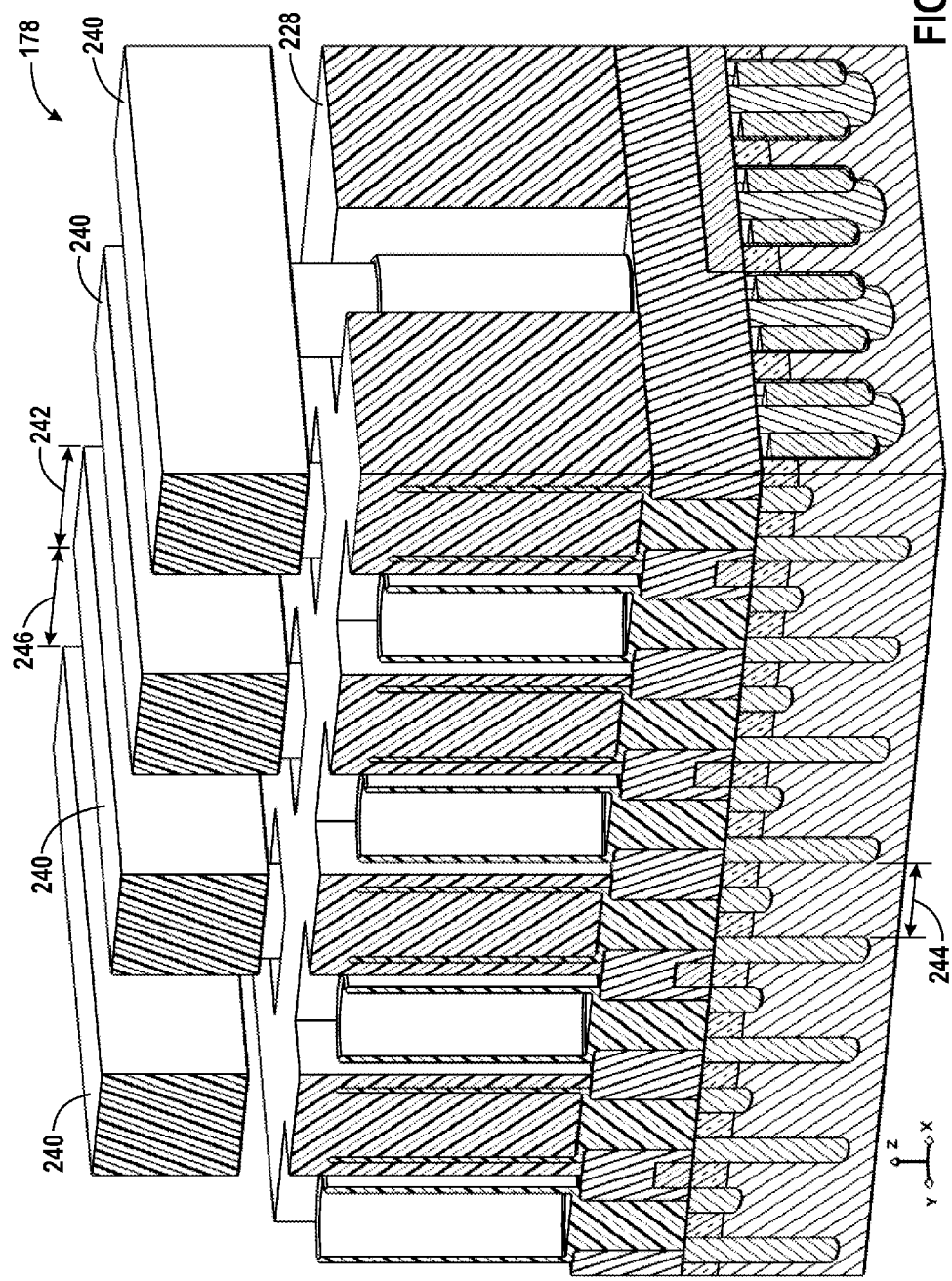

As illustrated by FIG. 15, lower global data lines 240 may be formed on the array 178. The global data lines 240 may be made of a conductive material, e.g., titanium, tungsten, aluminum, or copper, and they may make electrical contact with the contacts 238. In some embodiments, the lower global data lines 240 are formed from a metal layer deposited by physical vapor deposition (PVD) or electroplating. The lower global data lines 240 may be generally straight, generally parallel, and may generally extend in the Y direction. The lower global data lines 240 may have a width 242 that is generally equal to or larger than a width 244 of the fins 180 in the X direction. The lower global data lines 240 may be separated from one another by a distance 246 that is generally equal to, generally smaller than, or generally larger than the width 242. In some embodiments, the lower global data lines 240 may be isolated from the capacitor plate 228 by a dielectric layer, which is not shown in FIG. 15 to better illustrate other features of the array 178. Additionally, in some embodiments, the space between and above the lower global data lines 240 may be filled partially or entirely with a dielectric material.

Figure 16:
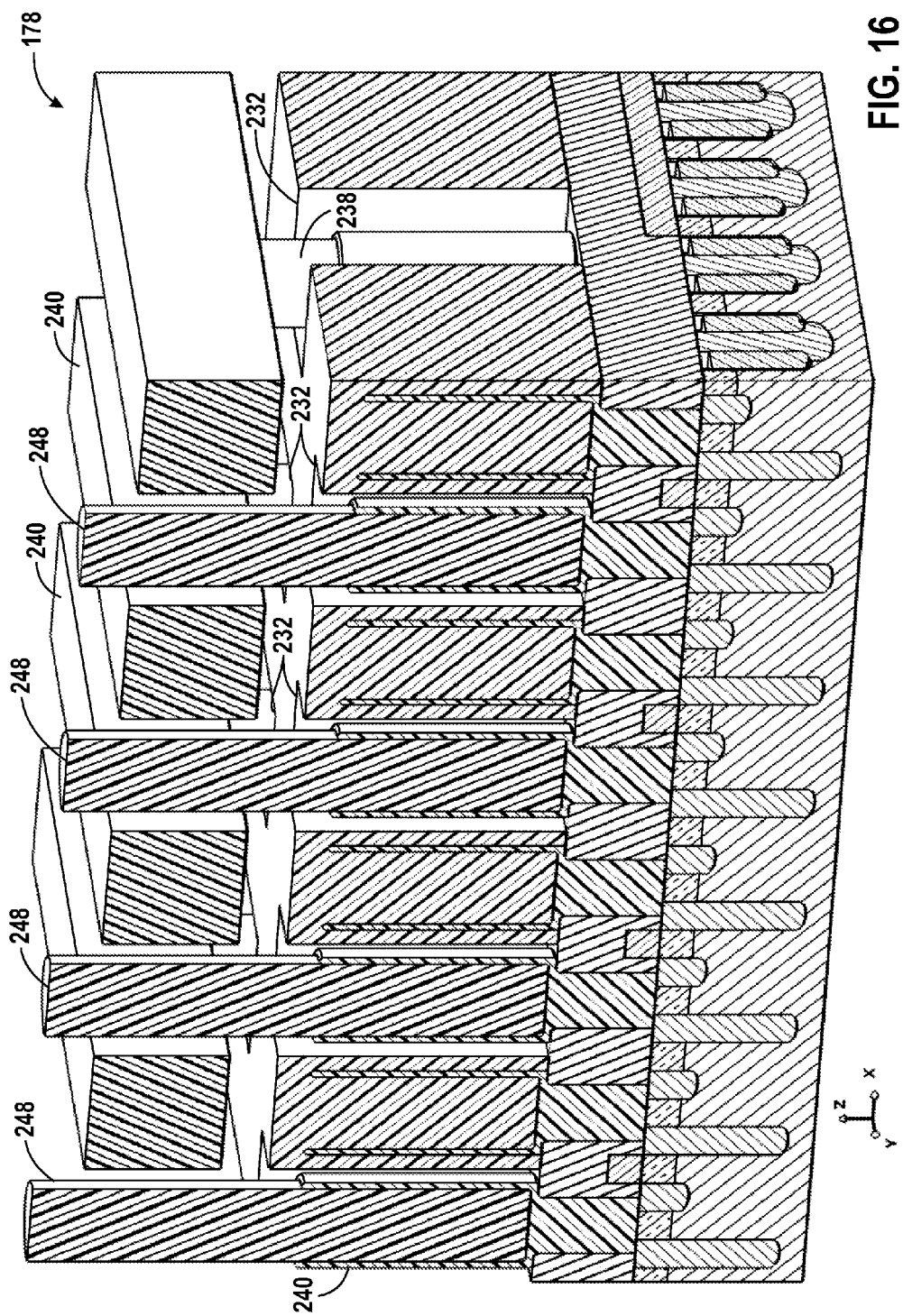

Next, contacts 248 may be formed in the array 178, as illustrated by FIG. 16. The contacts 248 may extend into the apertures 232 that are unoccupied by the previously formed contacts 238. These apertures 232 may, in some embodiments, be formed after forming the global data lines 242, a sequence that may form an opening in dielectric material disposed under the lower global data lines 240. Alternatively, or additionally, an upper aperture may be opened to the apertures 232 prior to forming the contacts 248. In some embodiments, a dielectric sidewall spacer is formed within the aperture 232 prior to forming the contacts 248. The contacts 248 may extend above the lower global data lines 240 and make electrical contact with the capacitor plates 220 in the open apertures 232. As with the previous contacts 238, the presently describe contacts 248 may be larger than, or misaligned with, the capacitor plates 220, and they may be in contact with two or more adjacent capacitor plates 220. The illustrated contacts 248, like the previously described contacts 238, are coupled to alternating rows of capacitor plates 220.

In other embodiments, the contacts 238 and 248 may extend to the source or drain of the transistors 176. In some embodiments, all or part of the capacitor plates 220 may be omitted over the transistors 176 to which the contacts 238 and 248 connect. In these embodiments, the contacts 238 and 248 may extend through the dielectric 230.

Figure 17:
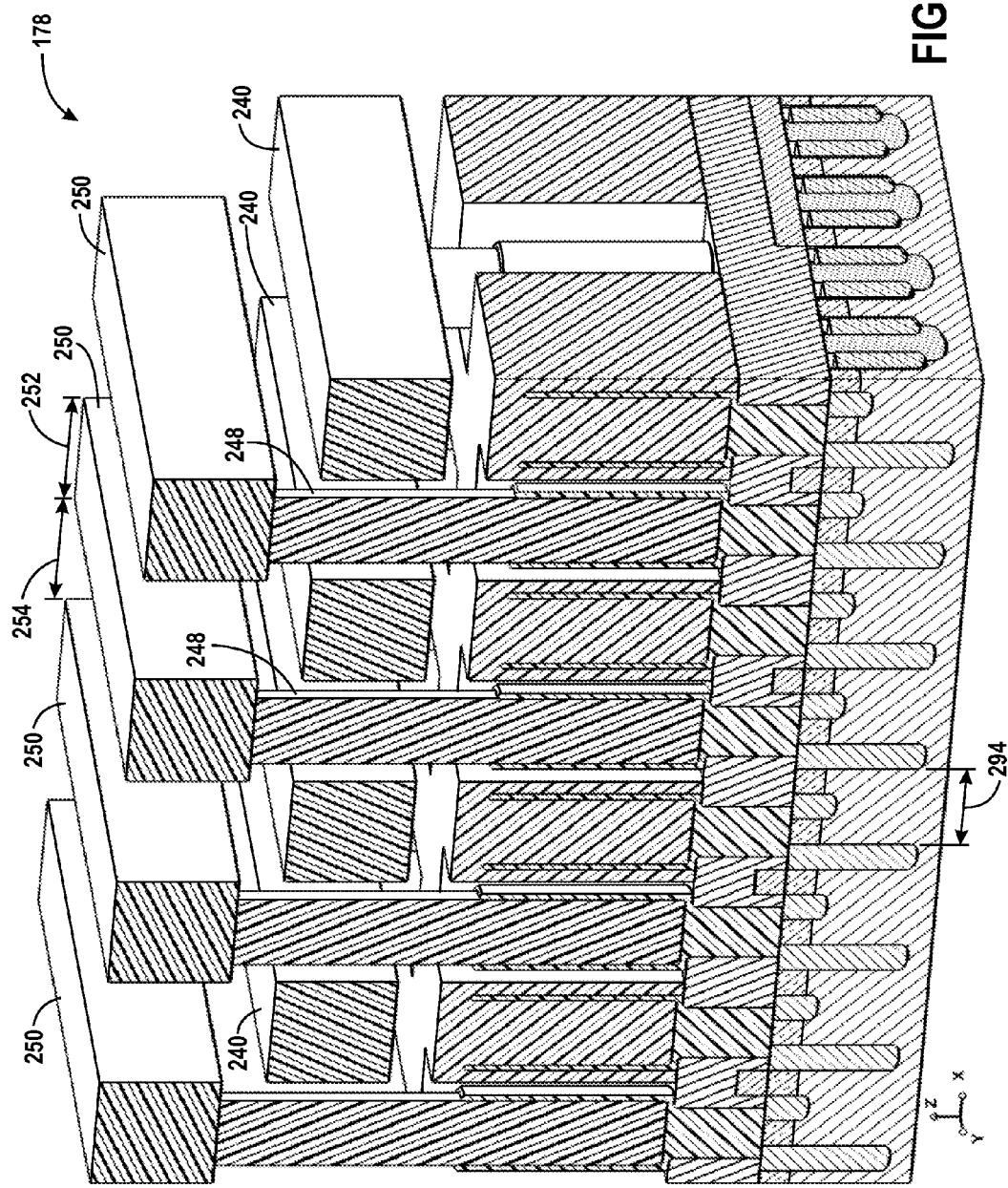
Figure 18:
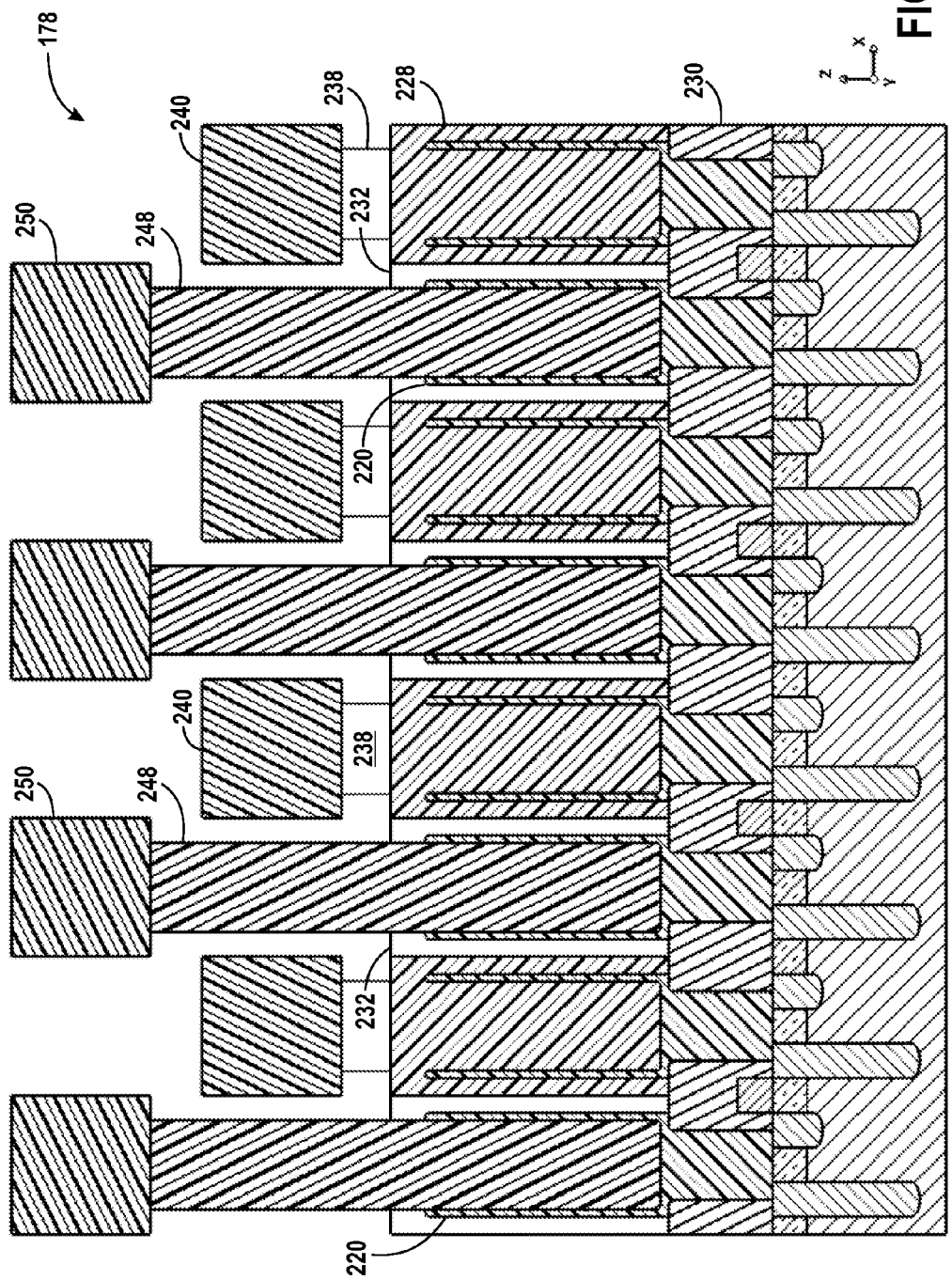
Figure 19:
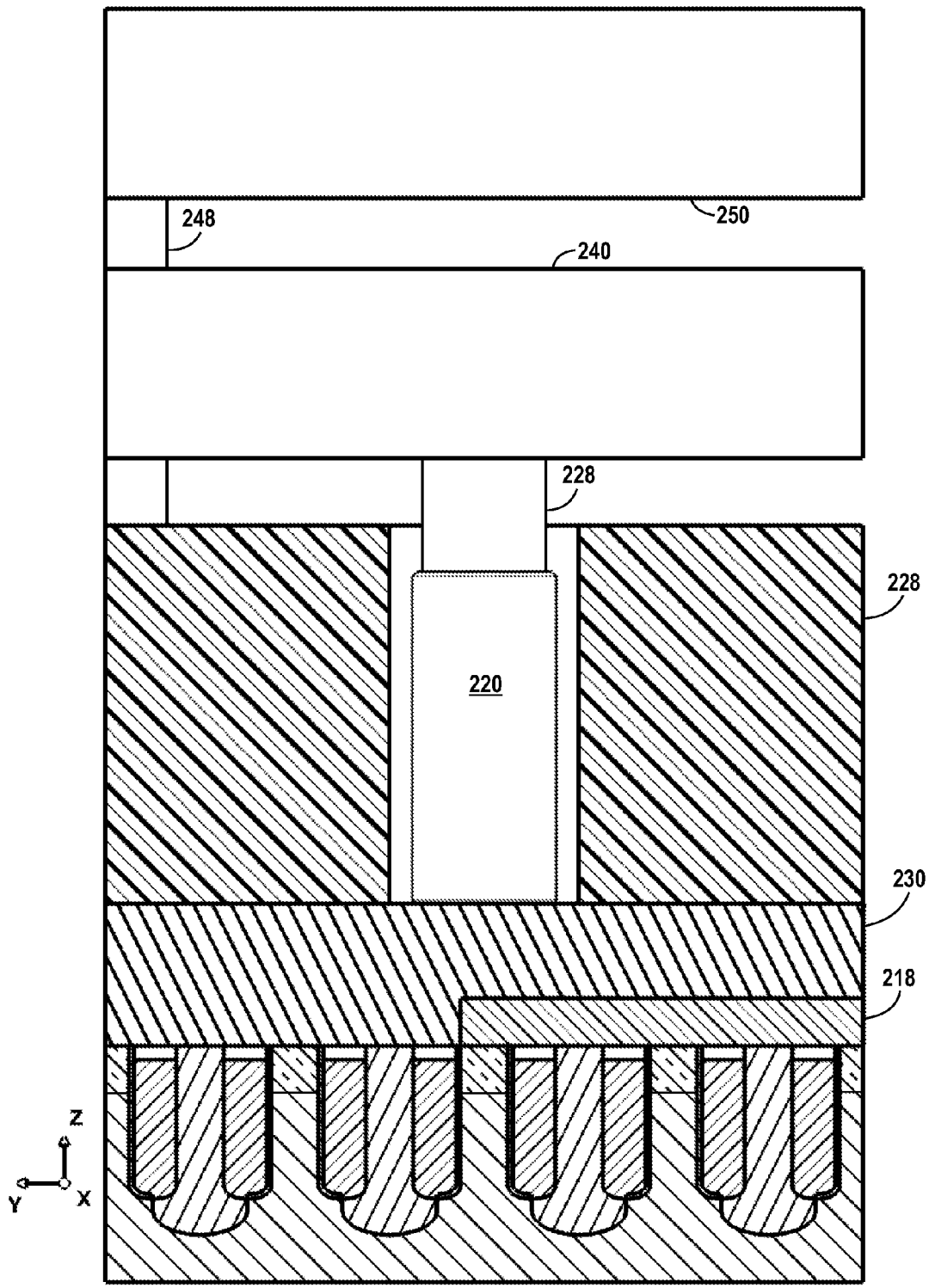
Figure 20:
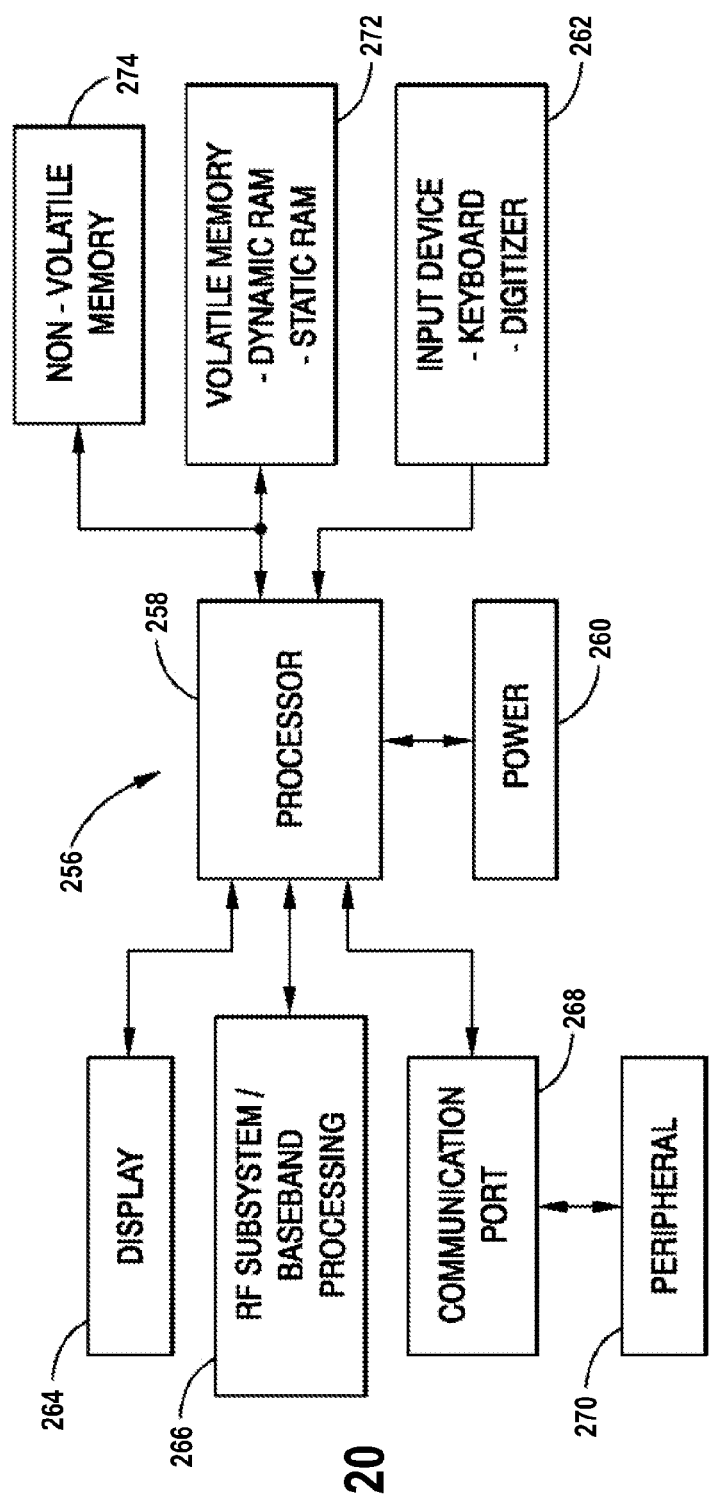
FIG. 20 illustrates a processor-based system in accordance with an embodiment of the present technique.

As illustrated by FIGS. 17-19, upper global data lines 250 may be formed on the array 178. The upper global data lines 250 may be made of the same material as the lower global data lines 240, and they may be formed with the same process. In this embodiment, the upper global data lines 250 are formed in a different metal layer than the lower global data lines 240, and they are generally straight, generally parallel to one another, and generally parallel to the lower global data lines 240. The upper global data lines 250 may connect to alternating rows of transistors 176 via the contacts 248. For example, the lower global data lines 240 may connect to the even-numbered rows, and the upper global data lines 250 may connect to the odd-numbered rows, or vice versa. Other embodiments may include additional levels global data lines, e.g., some embodiments may include three levels of global data lines that connect to every third transistor 176, or n levels that connect to every nth transistor, where n is equal to 5, 6, 7, 8, or a larger number.

The upper and lower global data lines 240 and 250 may be spaced further away from one another than the local data lines 218 (FIG. 10) in virtue of being formed in different metal layers and connecting to alternating rows of transistors 176. This increases spacing is believed to lower the parasitic capacitance of the global data lines 240 and 250. In other embodiments, though, the global data lines may be formed in the same metal layer and may connect to each row of transistors 176 rather than to alternating rows of transistors 176.

The array 178 may be connected to a local data line selector 168, sense amplifiers 165, and a control-line driver 170 in the manner illustrated by FIG. 7. For instance, the global data lines 240 and 250 may connect to the sense amplifiers 165, and the gates 206 and 208 of transistors 176 connected to contacts 238 or 248 may connect to the local data line selector 168. Among the remaining gates 206 and 208, some may connect to control-line driver 170, and some may remain floating or be grounded to form dummy transistors 176.

The illustrated array 178 may be configured to communicate with the sense amplifiers 165 relatively quickly. The global data lines 240 and 250 may have a lower parasitic capacitance than the local data lines 218, and multiple, relatively short local data lines 218 may connect to each global data line 240 and 250. In some embodiments, the path between the capacitor plates 220 and the sense amplifiers 165 may have a relatively low parasitic capacitance, and the voltage of the global data lines may respond relatively quickly to a current to or from the capacitor plates 220. Further, the illustrated array may accomplish this without significantly disrupting either the pattern of transistors 176 or the pattern of capacitor plates 220, which may increase the alignment margin when forming these structures and facilitate the use of sub-lithographic-resolution processes.

The embodiments illustrated by FIGS. 1, 7, and 17 may be included in a variety of systems. For instance, they may be included in the processor-based system 256 illustrated by FIG. 20. As is explained below, the system 256 may include various electronic devices manufactured in accordance with embodiments of the present technique. The system 256 may be any of a variety of types such as a computer, pager, cellular phone, personal organizer, control circuit, etc. In a typical processor-based system, one or more processors 258, such as a microprocessor, control the processing of system functions and requests in the system 256. The processor 258 and other subcomponents of the system 256 may include structures manufactured in accordance with embodiments of the present technique. For instance, the processor 258 may include the embodiments illustrated by FIGS. 1, 7, and 17 in cache memory.

The system 256 typically includes a power supply 260. For instance, if the system 256 is a portable system, the power supply 260 may include a fuel cell, permanent batteries, replaceable batteries, and/or rechargeable batteries. The power supply 260 may also include an AC adapter, so the system 256 may be plugged into a wall outlet, for instance. The power supply 260 may also include a DC adapter such that the system 256 may be plugged into a vehicle cigarette lighter, for instance.

Various other devices may be coupled to the processor 258 depending on the functions that the system 256 performs. For instance, a user interface 262 may be coupled to the processor 258. The user interface 262 may include buttons, switches, a keyboard, a light pen, a mouse, a digitizer and stylus, and/or a voice recognition system, for instance. A display 264 may also be coupled to the processor 258. The display 264 may include an LCD, an SED display, a CRT display, a DLP display, a plasma display, an OLED display, LEDs, and/or an audio display, for example. Furthermore, an RF sub-system/baseband processor 266 may also be coupled to the processor 258. The RF sub-system/baseband processor 266 may include an antenna that is coupled to an RF receiver and to an RF transmitter. One or more communication ports 268 may also be coupled to the processor 258. The communication port 268 may be adapted to be coupled to one or more peripheral devices 270 such as a modem, a printer, a computer, or to a network, such as a local area network, remote area network, intranet, or the Internet, for instance.

The processor 258 generally controls the system 256 by implementing software programs stored in the memory. The memory is coupled to the processor 258 to store and facilitate execution of various programs. For instance, the processor 258 may be coupled to the volatile memory 272 which may include Dynamic Random Access Memory (DRAM) and/or Static Random Access Memory (SRAM). The volatile memory 272 is typically large so that it can store dynamically loaded applications and data. The volatile memory 272 may be configured in accordance with embodiments of the present invention. For instance, the volatile memory 272 may include the embodiments illustrated by FIGS. 1, 7, and 17.

The processor 258 may also be coupled to non-volatile memory 274. The non-volatile memory 274 may include a read-only memory (ROM), such as an EPROM, and/or flash memory to be used in conjunction with the volatile memory 272. The size of the ROM is typically selected to be just large enough to store any necessary operating system, application programs, and fixed data. Additionally, the non-volatile memory 274 may include a high capacity memory such as a tape or disk drive memory. In some embodiments, the high capacity memory may store a variety of types of software, such as an operating system or a productivity suite. The non-volatile memory 274, as another example, may also include electronic devices manufactured in accordance with embodiments of the present technique. For example, the embodiments illustrated by FIGS. 1, 7, and 17 may include storage devices with a phase-change-memory material.

Figure 21:
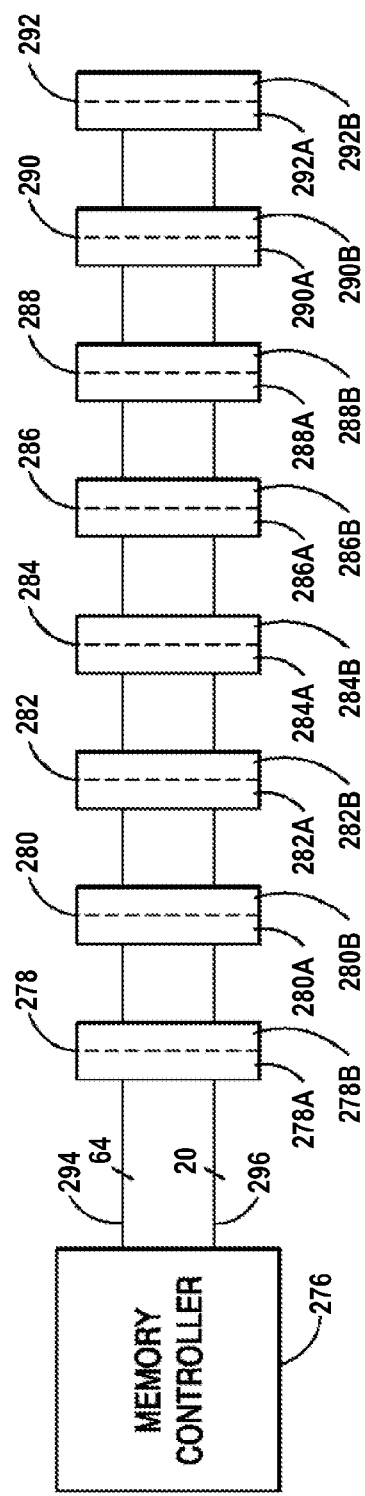
FIG. 21 illustrates a memory sub-system in accordance with an embodiment of the present technique.

FIG. 21 generally illustrates a block diagram of a portion of a memory sub-system, such as the volatile memory 272. A memory controller 276 is generally provided to facilitate access to storage devices in the volatile memory 272. The memory controller 276 may receive requests to access the storage devices via one or more processors, such as the processor 258, via peripheral devices, such as the peripheral device 270, and/or via other systems (not shown). The memory controller 276 is executes the requests to the memory devices and coordinating the exchange of information, including configuration information, to and from the memory devices.

The memory sub-system may include a plurality of slots 278-292. Each slot 278-292 is configured to operably couple a memory module, such as a dual-inline memory module (DIMM), to the memory controller 276 via one or more memory buses. Each DIMM generally includes a plurality of memory devices such as dynamic random access memory (DRAM) devices capable of storing data, as described further below with reference to FIG. 22. As described further below, each DIMM has a number of memory devices on each side of the module. Each side of the module may be referred to as a "rank." Accordingly, each slot 278-292 is configured to receive a single DIMM having two ranks. For instance, the slot 278 is configured to receive a DIMM having ranks 278A and 278B, the slot 280 is configured to receive a DIMM having ranks 280A and 280B, and so forth. In the present embodiment, each of the eight memory slots 278-292 is capable of supporting a module comprising eight individual memory devices on each rank 278A/B-292A/B, as illustrated with FIG. 22 described below.

Referring again to FIG. 21, the memory buses may include a memory data bus 294 to facilitate the exchange of data between each memory device on the DIMMs and the memory controller 276. The memory data bus 294 comprises a plurality of single bit data buses, or transmission lines, each coupled from the memory controller 276 to a memory device. In one embodiment of the volatile memory 272, the memory data bus 294 may include 64 individual data buses. Further, the memory data bus 294 may include one or more individual buses to each memory rank 278A/B-292A/B which may be used for ECC error detection and correction. As can be appreciated by those skilled in the art, the individual buses of the memory data bus 294 will vary depending on the configuration and capabilities of the system 256.

The volatile memory 272 also includes a command bus 296 on which address information such as command address (CA), row address select (RAS#), column address select (CAS#), write enable (WE#), bank address (BA), chip select (CS#), clock enable (CKE), and on-die termination (ODT), for example, may be delivered for a corresponding request. Further, the command bus 296 may also be used to facilitate the exchange of configuration information at boot-up. As with the memory data bus 294, the command bus 296 may include a plurality of individual command buses. In the present embodiment, the command bus 296 may include 20 individual buses. As previously described with reference to the memory data bus 294, a variety of embodiments may be implemented for the command bus 296 depending on the system configuration.

Figure 22:
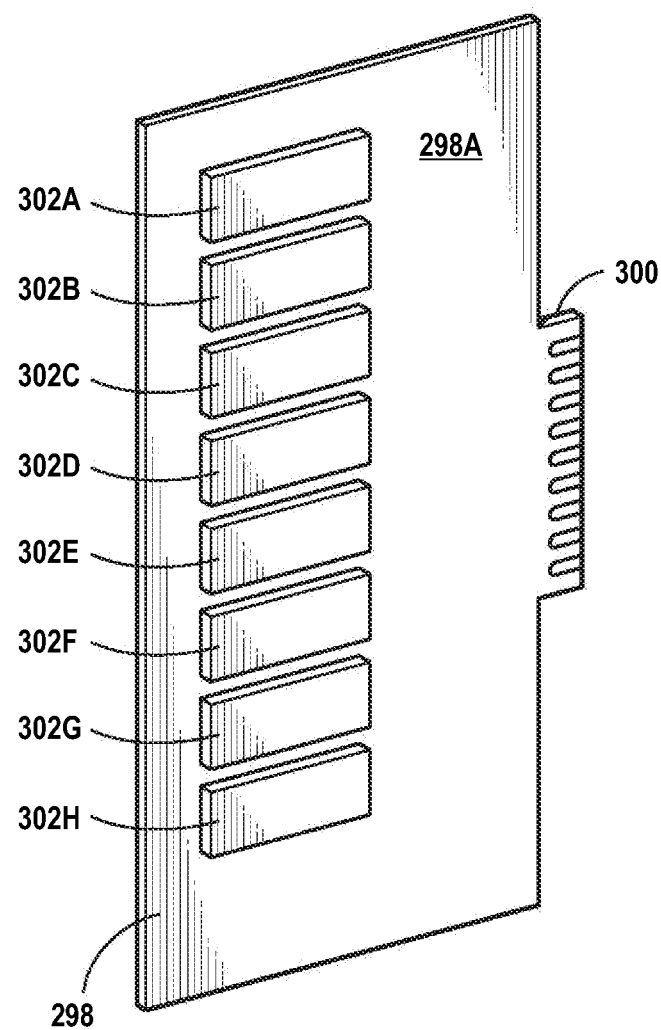
FIG. 22 illustrates a memory module in accordance with an embodiment of the present technique.

FIG. 22 illustrates a memory module 298, such as a DIMM, that may be inserted into one of the memory slots 278-292 (FIG. 21). In the present view, one side of the memory module 298 is illustrated and designated as the rank 298A. As previously discussed, the memory module 298 may include two ranks 298A and 298B. The rank 298A includes a plurality of memory devices 302A-302H, such as dynamic random access memory (DRAM) devices. The second opposing side of the memory module 298 (298B, not shown) also includes a number of memory devices. The memory module 298 may include an edge connector 300 to facilitate mechanical coupling of the memory module 300 into one of the memory slots 278-292. Further, the edge connector 300 provides a mechanism for electrical coupling to facilitate the exchange of data and control signals from the memory controller 276 to the memory devices 302A-302H (and the memory devices on the second ranks). The embodiment of FIG. 22 may be employed in accordance with various standards. For instance, the memory module 298 may be employed in a single data rate (SDR), fully buffered (FB)-DIMM, double data rate (DDR), double data rate 2 (DDR2), or double data rate 3 (DDR3) system 10. The memory devices 302A-302H may each include one of the embodiments illustrated by FIGS. 1, 7, and 17.

Figure 23:
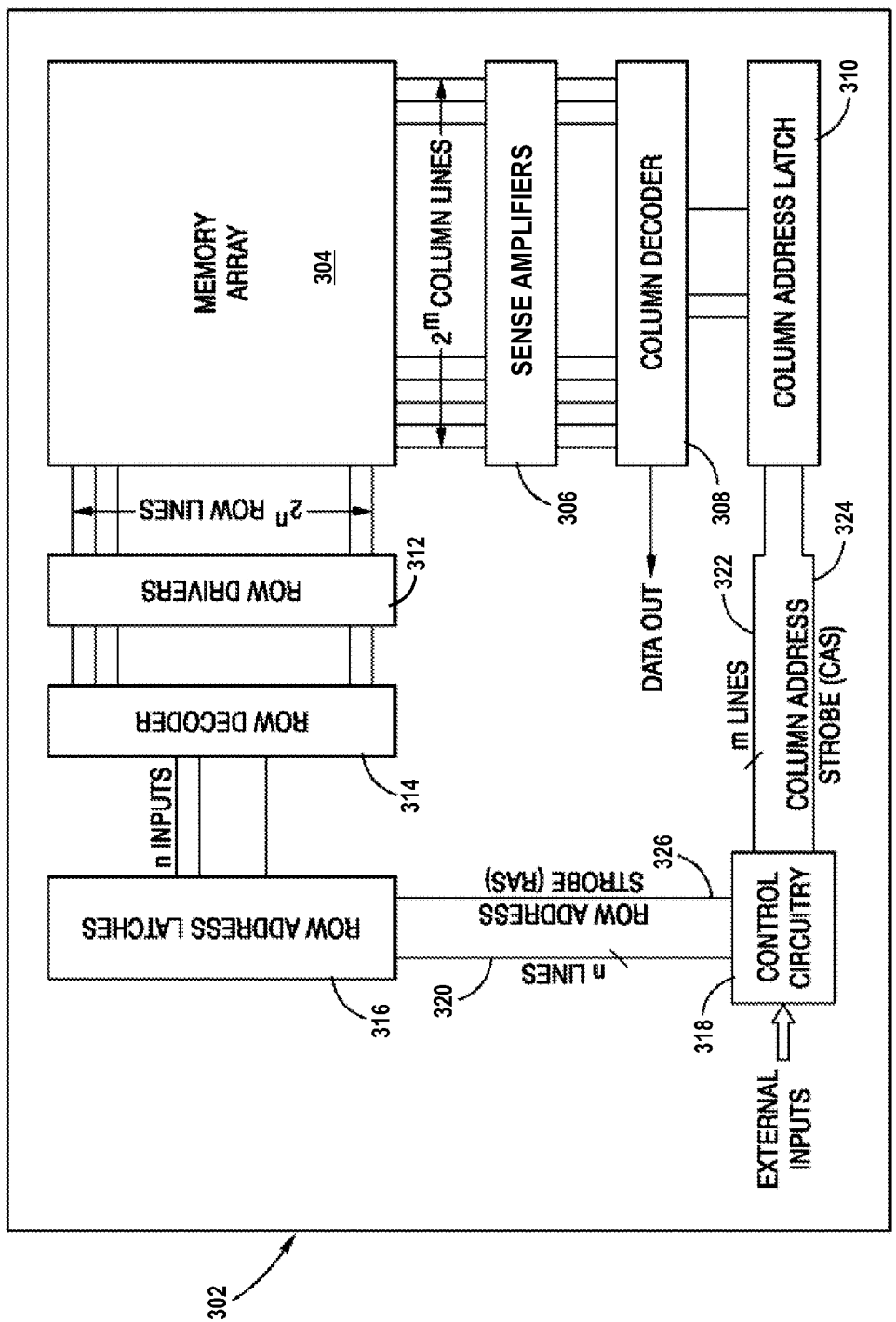
FIG. 23 illustrates a memory device in accordance with an embodiment of the present technique.

FIG. 23 depicts a block diagram of an embodiment of the memory devices 302A-302H. The illustrated memory device 302 may include a memory array 304, sense amplifiers 306, a column decoder 308, a column address latch 310, row drivers 312, a row decoder 314, row address latches 316, and control circuitry 318. The memory array 304 may include one of the embodiments illustrated by FIGS. 1, 7, and 17.

When accessing the memory cells, the control circuitry may receive a command to read from or write to a target memory address. The control circuitry 318 may then convert the target address into a row address and a column address. In the illustrated embodiment, the row address bus 320 transmits the row address to the row address latches 316, and a column address bus 322 transmits column address to the column address latches 310. After an appropriate settling time, a row address strobe (RAS) signal 326 (or other controlling clock signal) may be asserted by the control circuitry 318, and the row address latches 316 may latch the transmitted row address. Similarly, the control circuitry 318 may assert a column address strobe 324, and the column address latches 310 may latch the transmitted column address.

Once row and column addresses are latched, the row decoder 314 may determine which row of the memory array 304 corresponds to the latched row address, and the row drivers 312 may assert a signal on the selected row. In some embodiments, this may entail asserting a signal on a selected control line and a selected subgroup-select line. Similarly, the column decoder 308 may determine which column of the memory array 304 corresponds with the latched column address, and the sense amplifiers 306 may sense a voltage or current on the selected column. For the reasons explained above, the memory array 14 may transmit data relatively quickly to the sense amplifiers 306 through both a local data line and a global data line.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of forming a memory device, comprising:
    forming an array of transistors;
    forming a plurality of subgroups of transistors from the transistors among the array of transistors by connecting the transistors within the subgroups with local data lines;
    forming an array of storage devices, wherein each storage device among the array of storage devices is connected to a transistor among the array of transistors;
    forming a plurality of word lines, wherein a common word line of the plurality of word lines is coupled to both a first and a second subgroup of the plurality of subgroups, wherein a second word line of the plurality of word lines is not coupled to both the first and the second subgroup; and connecting each global data line among a plurality of global data lines to the plurality of subgroups of transistors by connecting the global data line to at least a portion of storage devices among the array of storage devices, wherein each global data line is connected to only one subgroup sharing a common word line.

2. The method of claim 1, wherein forming the array of transistors comprises forming a cross-point array of transistors.

3. The method of claim 1, wherein forming the array of transistors comprises forming multi-gate transistors.

4. The method of claim 1, wherein forming the array of transistors comprises forming a generally rectangular lattice of fin field-effect transistors that are generally disposed in rows and columns.

5. The method of claim 1, wherein forming an array of storage devices comprises forming an array of capacitor plates.

6. The method of claim 5, wherein connecting each global data line comprises forming an aperture in an upper capacitor plate that is disposed above the array of capacitor plates.

7. The method of claim 1, comprising forming a plurality of local data line access devices, wherein each of the plurality of local data line access devices is coupled between a respective one of the plurality of subgroups of transistors and a respective one of the plurality of global data lines.

8. The method of claim 7, comprising coupling a gate of each of the plurality of local data line access devices to a subgroup-select line.

9. A memory device, comprising:
an array of transistors, comprising a plurality of subgroups of transistors, wherein each of the transistors in respective subgroup of transistors is coupled to a respective local data line;
an array of storage devices, wherein each storage device among the array of storage devices is coupled to a respective transistor among the array of transistors;
a plurality of word lines, wherein a common word line of the plurality of word lines is coupled to both a first and a second subgroup of the plurality of subgroups, wherein a second word line of the plurality of word lines is not coupled to both the first and the second subgroup; and
a global data line coupled to a plurality of the subgroups of transistors by at least a portion of storage devices among the array of storage devices, wherein each global data line is connected to only one subgroup sharing a common word line.

10. The device of claim 9, wherein the array of transistors comprises a cross-point array of transistors.

11. The device of claim 9, wherein the array of transistors comprises multi-gate transistors.

12. The device of claim 9, wherein the array of transistors comprises a generally rectangular lattice of fin field-effect transistors that are generally disposed in rows and columns.

13. The device of claim 9, wherein the array of storage devices comprises an array of capacitor plates.

14. The device of claim 13, comprising an upper capacitor plate disposed above the array of capacitor places and coupled to each global data line via an aperture.

15. The device of claim 9, comprising a plurality of local data line access devices, wherein each of the plurality of local data line access devices is coupled between a respective one of the plurality of subgroups of transistors and a respective one of the plurality of global data lines.

16. The device of claim 15, comprising wherein a gate of each of the plurality of local data line access devices is coupled to a subgroup-select line.

17. A memory device, comprising:
a first plurality of memory cells connected to a first local-conductor-access device through a first local conductor and connected to a first set of word lines, wherein the first local-conductor-access device is also connected to a portion of a first storage device;
a second plurality of memory cells connected to a second local-conductor-access device through a second local conductor and connected to a second set of word lines separate from the first set of word lines, wherein the second local-conductor-access device is also connected to a portion of a second storage device; and
a global conductor connected to both the first local-conductor-access device through the first portion of a storage device and the second local-conductor-access device through the second portion of a storage device.

18. The device of claim 17, wherein each memory cell among the first plurality of memory cells comprises an access device and a storage device.

19. The device of claim 17, wherein each memory cell among the first plurality of memory cells comprises a capacitor plate or an electrode for a phase change memory element.

20. The device of claim 17, wherein each of the memory cell among the first plurality of memory cells comprises a finFET.

* * * * *